(12) United States Patent
Motta et al.

(10) Patent No.: US 12,190,031 B2
(45) Date of Patent: Jan. 7, 2025

(54) GENERALIZATION OF A QUANTUM IMAGINARY TIME EVOLUTION PROCESS AND SIMULATION BY TENSOR NETWORKS

(71) Applicant: International Business Machines Corporation, Armonk, NY (US)

(72) Inventors: Mario Motta, San Jose, CA (US); Yuya Jeremy Ong, San Jose, CA (US); Barbara Anne Jones, Los Gatos, CA (US); Joseph A. Latone, San Francisco, CA (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 909 days.

(21) Appl. No.: 17/091,721

(22) Filed: Nov. 6, 2020

(65) Prior Publication Data

US 2022/0147667 A1    May 12, 2022

(51) Int. Cl.
*G06F 30/27*    (2020.01)
*G06F 17/16*    (2006.01)
(Continued)

(52) U.S. Cl.
CPC ............. *G06F 30/27* (2020.01); *G06N 10/00* (2019.01); *G06F 17/16* (2013.01); *G06N 10/20* (2022.01); *G06N 10/60* (2022.01)

(58) Field of Classification Search
None
See application file for complete search history.

(56) References Cited

U.S. PATENT DOCUMENTS 8,374,827 B2    2/2013   Hirose et al.
9,152,746 B2   10/2015   Troyer et al.
(Continued)

FOREIGN PATENT DOCUMENTS

WO   2019126644   6/2019
WO   2020037300   2/2020
WO   2020095051   5/2020

OTHER PUBLICATIONS

McArdle, S., Jones, T., Endo, S. et al. Variational ansatz-based quantum simulation of imaginary time evolution. npj Quantum Inf 5, 75 (2019). https://doi.org/10.1038/s41534-019-0187-2 (Year: 2019).*
(Continued)

*Primary Examiner* — Akash Saxena
(74) *Attorney, Agent, or Firm* — Amin, Turocy & Watson, LLP

(57) ABSTRACT

Systems, computer-implemented methods, and computer program products to facilitate generalization of a quantum imaginary time evolution process and simulation by tensor networks are provided. According to an embodiment, a system can comprise a processor that executes computer executable components stored in memory. The computer executable components can comprise a universal component that generalizes a quantum imaginary time evolution process to provide a quantum imaginary time evolution ansatz process. The computer executable components can further comprise a simulation component that applies the quantum imaginary time evolution ansatz process to one or more general multi-body quantum systems.

15 Claims, 16 Drawing Sheets

(51) Int. Cl.
  *G06N 10/00* (2022.01)
  *G06N 10/20* (2022.01)
  *G06N 10/60* (2022.01)

(56) References Cited

U.S. PATENT DOCUMENTS

| | | | | |
|---|---|---|---|---|
| 10,311,370 | B2* | 6/2019 | Bravyi | G06N 10/00 |
| 10,417,574 | B2 | 9/2019 | Babbush et al. | |
| 10,599,989 | B2* | 3/2020 | Bravyi | G06N 10/00 |
| 11,615,329 | B2* | 3/2023 | Wang | G06N 10/00 |
| | | | | 706/46 |
| 11,714,936 | B2* | 8/2023 | Kushibe | G06F 30/20 |
| | | | | 703/13 |
| 2014/0297247 | A1* | 10/2014 | Troyer | G06F 30/20 |
| | | | | 703/21 |
| 2019/0095811 | A1* | 3/2019 | Antonio | G06N 10/00 |
| 2019/0332731 | A1 | 10/2019 | Chen et al. | |
| 2020/0356890 | A1* | 11/2020 | Ashrafi | G06N 10/00 |
| 2021/0011748 | A1* | 1/2021 | Lee | G06N 10/60 |
| 2021/0081804 | A1* | 3/2021 | Stojevic | G06N 10/00 |
| 2021/0173810 | A1* | 6/2021 | Feig | G06N 10/60 |
| 2021/0193270 | A1* | 6/2021 | Stober | G16C 10/00 |
| 2021/0398621 | A1* | 12/2021 | Stojevic | G16C 10/00 |
| 2022/0164501 | A1* | 5/2022 | Nosanow | G06N 10/60 |
| 2022/0269967 | A1* | 8/2022 | Lv | G06N 10/60 |
| 2022/0383992 | A1* | 12/2022 | Triendl | G06N 10/20 |
| 2023/0040584 | A1* | 2/2023 | Baker | G06N 10/20 |
| 2023/0385681 | A1* | 11/2023 | Montanaro | G06N 10/20 |

OTHER PUBLICATIONS

Y. J. Ong, M. Qiao and D. Jadav, "Temporal Tensor Transformation Network for Multivariate Time Series Prediction," 2020 IEEE International Conference on Big Data (Big Data), Atlanta, GA, USA, 2020, pp. 1594-1603, doi: 10.1109/BigData50022.2020. 9378059. (Year: 2020).*

Mario Motta et al, Quantum Imaginary Time Evolution, Quantum Lanczos, and Quantum Thermal Averaging, Nat. Phys. (2019), pp. 15, ttps://arxiv.org/abs/1901.07653v2 (Year: 2019).*

Yu, Xiongjie., Many-Body Localization and Tensor Networks ProQuest Dissertations and Theses ProQuest Dissertations Publishing. (2018), 148 Pgs. (Year: 2018).*

Lorenz S. Cederbaum, "Exact many-body wave function and properties of trapped bosons in the infinite-particle limit", Phys. Rev. A 96, 013615, pp. 18—Published Jul. 13, 2017 (Year: 2017).*

Abrams, Daniel S., and Seth Lloyd. "Simulation of many-body Fermi systems on a universal quantum computer." Physical Review Letters 79.13 (1997): 2586. (Year: 1997).*

Shi-Ning Sun et al, Quantum Computation of Finite-Temperature Static and Dynamical Properties of Spin Systems Using Quantum Imaginary Time Evolution, PRX Quantum 2, 010317—Published Feb. 1, 2021 (Year: 2021).*

Mell et al., "The NIST Definition of Cloud Computing," Recommendations of the National Institute of Standards and Technology, NIST Special Publication 800-145, Sep. 2011, 7 pages.

Motta et al., "Determining eigenstates and thermal states on a quantum computer using quantum imaginary time evolution," Nature Physics 16, arXiv:1901.07653 [quant-ph], 2019, 18 pages.

Sleijpen et al., "A Jacobi-Davidson iteration method for linear eigenvalue problems," SIAM Journal on Matrix Analysis and Applications, vol. 17, Issue 2, 1996, 25 pages.

Orus, "A Practical Introduction to Tensor Networks: Matrix Product States and Projected Entangled Pair States," Annals of Physics 349, arXiv:1306.2164 [cond-mat.str-el], 2014, 51 pages.

* cited by examiner

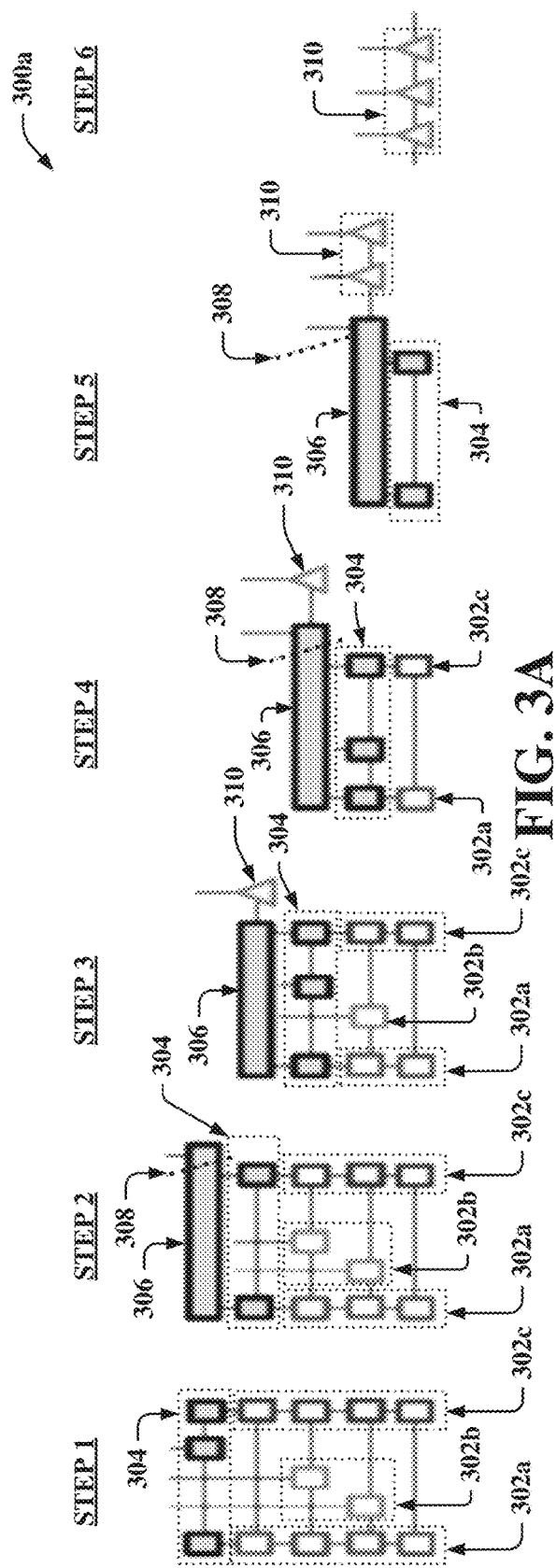
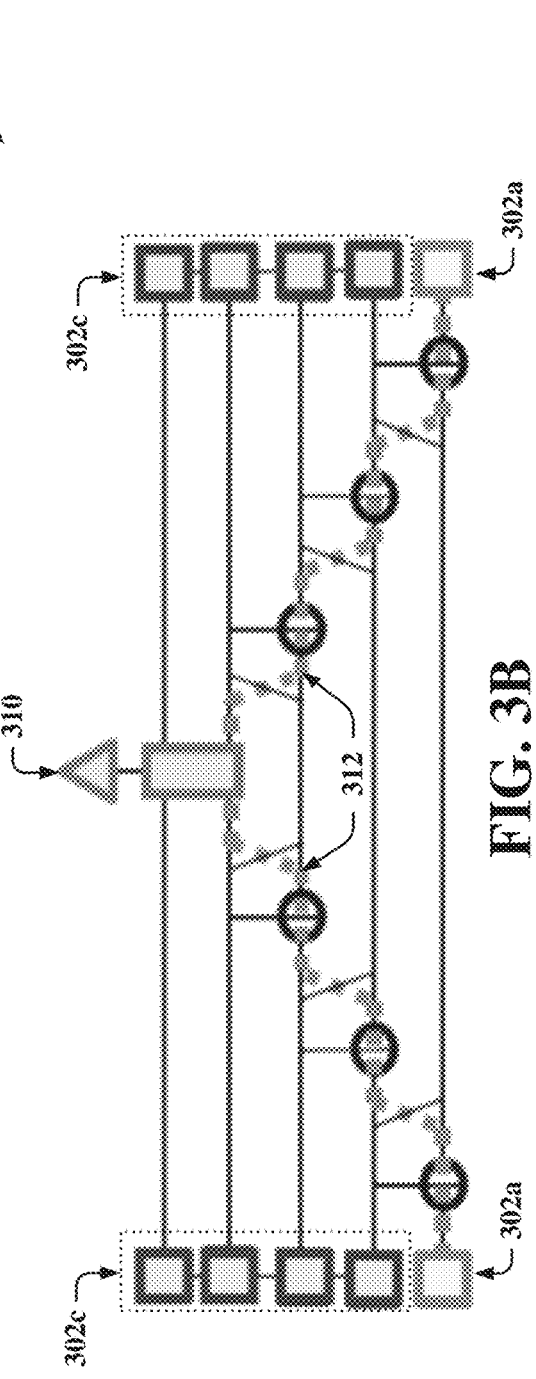
FIG. 3A
FIG. 3B

GENERALIZATION OF A QUANTUM IMAGINARY TIME EVOLUTION PROCESS AND SIMULATION BY TENSOR NETWORKS

BACKGROUND

The subject disclosure relates to a quantum imaginary time evolution process, and more specifically, to generalization of a quantum imaginary time evolution process and simulation by tensor networks.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, systems, devices, computer-implemented methods, and/or computer program products that facilitate generalization of a quantum imaginary time evolution process and simulation by tensor networks are described.

According to an embodiment, a system can comprise a processor that executes computer executable components stored in memory. The computer executable components can comprise a universal component that generalizes a quantum imaginary time evolution process to provide a quantum imaginary time evolution ansatz process. The computer executable components can further comprise a simulation component that applies the quantum imaginary time evolution ansatz process to one or more general multi-body quantum systems.

According to another embodiment, a computer-implemented method can comprise generalizing, by a system operatively coupled to a processor, a quantum imaginary time evolution process to provide a quantum imaginary time evolution ansatz process. The computer-implemented method can further comprise applying, by the system, the quantum imaginary time evolution ansatz process to one or more general multi-body quantum systems.

According to another embodiment, a computer program product comprising a computer readable storage medium having program instructions embodied therewith, the program instructions executable by a processor to cause the processor to generalize a quantum imaginary time evolution process to provide a quantum imaginary time evolution ansatz process. The program instructions are further executable by the processor to cause the processor to apply the quantum imaginary time evolution ansatz process to one or more general multi-body quantum systems.

DESCRIPTION OF THE DRAWINGS

FIGS. 3A and 3B illustrate example, non-limiting diagrams that can facilitate generalization of a quantum imaginary time evolution process and simulation by tensor networks in accordance with one or more embodiments described herein.

DETAILED DESCRIPTION

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

Quantum computing is generally the use of quantum-mechanical phenomena for the purpose of performing computing and information processing functions. Quantum computing can be viewed in contrast to classical computing, which generally operates on binary values with transistors. That is, while classical computers can operate on bit values that are either 0 or 1, quantum computers operate on quantum bits (qubits) that comprise superpositions of both 0 and 1, can entangle multiple quantum bits, and use interference.

Finding Hamiltonian eigenstates $\hat{H}|\Psi\rangle = E|\psi\rangle$ and thermal states $\rho_\beta = e^{-\beta\hat{H}}/\text{Tr}[e^{-\beta\hat{H}}]$ is an important application for quantum computers, where E denotes an eigenvalue of the Hamiltonisn, $\beta$ denotes the inverse temperature of the system, and Tr denotes the trace operation. There are a variety of algorithms that address this problem on contemporary quantum hardware including hybrid quantum-classical variational approaches and the recently introduced quantum imaginary time evolution (QITE) algorithm (also referred to herein as "quantum imaginary time evolution process").

Existing technologies apply QITE to the investigation of ground, excited, and finite-temperature states of spin and small Fermi systems. While the application of QITE to spin systems has been thoroughly investigated, its extension to general multi-body systems (e.g., boson, fermions, boson-fermion-spin mixtures) is less understood and established. Software to simulate QITE on classical computers is available, but its cost (e.g., computational cost) scales exponentially as a function of the size of the studied system. These drawbacks limit the flexibility and efficiency of QITE.

Figure 1:
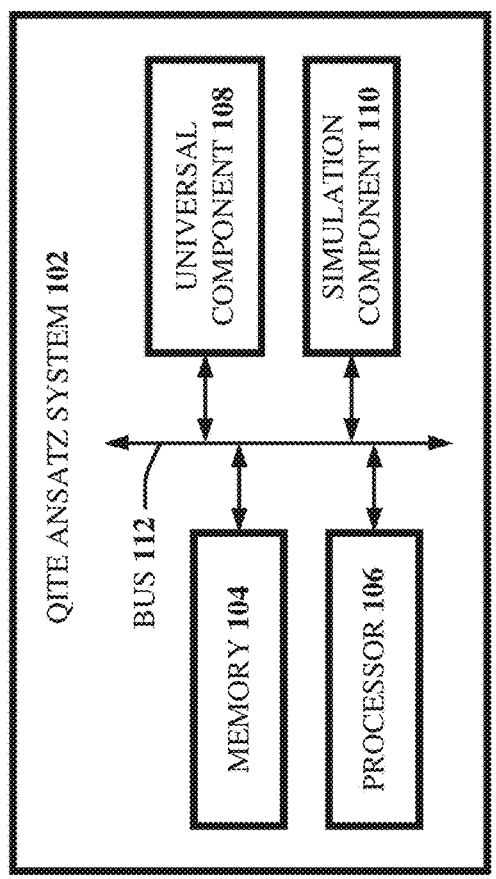
FIG. 1 illustrates a block diagram of an example, non-limiting system that can facilitate generalization of a quantum imaginary time evolution process and simulation by tensor networks in accordance with one or more embodiments described herein.

FIG. 1 illustrates a block diagram of an example, non-limiting system 100 that can facilitate generalization of a quantum imaginary time evolution process and simulation by tensor networks in accordance with one or more embodiments described herein. System 100 can comprise a quantum imaginary time evolution ansatz system 102 (referred to herein as "QITE ansatz system 102"). QITE ansatz system 102 can comprise a memory 104, a processor 106, a universal component 108, a simulation component 110, and/or a bus 112.

It should be appreciated that the embodiments of the subject disclosure depicted in various figures disclosed herein are for illustration only, and as such, the respective architectures of such embodiments are not limited to the systems, devices, and/or components depicted therein. For example, in some embodiments, system 100 and/or QITE ansatz system 102 can further comprise various computer and/or computing-based elements described herein with reference to operating environment 800 and FIG. 8. In several embodiments, such computer and/or computing-based elements can be used in connection with implementing one or more of the systems, devices, components, and/or computer-implemented operations shown and described in connection with FIG. 1 or other figures disclosed herein.

Memory 104 can store one or more computer and/or machine readable, writable, and/or executable components and/or instructions that, when executed by processor 106 (e.g., a classical processor, a quantum processor, and/or another type of processor), can facilitate performance of operations defined by the executable component(s) and/or instruction(s). For example, memory 104 can store computer and/or machine readable, writable, and/or executable components and/or instructions that, when executed by processor 106, can facilitate execution of the various functions described herein relating to QITE ansatz system 102, universal component 108, simulation component 110, and/or another component associated with QITE ansatz system 102, as described herein with or without reference to the various figures of the subject disclosure.

Memory 104 can comprise volatile memory (e.g., random access memory (RAM), static RAM (SRAM), dynamic RAM (DRAM), and/or another type of volatile memory) and/or non-volatile memory (e.g., read only memory (ROM), programmable ROM (PROM), electrically programmable ROM (EPROM), electrically erasable programmable ROM (EEPROM), and/or another type of non-volatile memory) that can employ one or more memory architectures. Further examples of memory 104 are described below with reference to system memory 816 and FIG. 8. Such examples of memory 104 can be employed to implement any embodiments of the subject disclosure.

Processor 106 can comprise one or more types of processors and/or electronic circuitry (e.g., a classical processor, a quantum processor, and/or another type of processor) that can implement one or more computer and/or machine readable, writable, and/or executable components and/or instructions that can be stored on memory 104. For example, processor 106 can perform various operations that can be specified by such computer and/or machine readable, writable, and/or executable components and/or instructions including, but not limited to, logic, control, input/output (I/O), arithmetic, and/or the like. In some embodiments, processor 106 can comprise one or more central processing unit, multi-core processor, microprocessor, dual microprocessors, microcontroller, System on a Chip (SOC), array processor, vector processor, quantum processor, and/or another type of processor. Further examples of processor 106 are described below with reference to processing unit 814 and FIG. 8. Such examples of processor 106 can be employed to implement any embodiments of the subject disclosure.

QITE ansatz system 102, memory 104, processor 106, universal component 108, simulation component 110, and/or another component of QITE ansatz system 102 as described herein can be communicatively, electrically, operatively, and/or optically coupled to one another via a bus 112 to perform functions of system 100, QITE ansatz system 102, and/or any components coupled therewith. Bus 112 can comprise one or more memory bus, memory controller, peripheral bus, external bus, local bus, a quantum bus, and/or another type of bus that can employ various bus architectures. Further examples of bus 112 are described below with reference to system bus 818 and FIG. 8. Such examples of bus 112 can be employed to implement any embodiments of the subject disclosure.

QITE ansatz system 102 can comprise any type of component, machine, device, facility, apparatus, and/or instrument that comprises a processor and/or can be capable of effective and/or operative communication with a wired and/or wireless network. All such embodiments are envisioned. For example, QITE ansatz system 102 can comprise a server device, a computing device, a general-purpose computer, a special-purpose computer, a quantum computing device (e.g., a quantum computer), a tablet computing device, a handheld device, a server class computing machine and/or database, a laptop computer, a notebook computer, a desktop computer, a cell phone, a smart phone, a consumer appliance and/or instrumentation, an industrial and/or commercial device, a digital assistant, a multimedia Internet enabled phone, a multimedia players, and/or another type of device.

QITE ansatz system 102 can be coupled (e.g., communicatively, electrically, operatively, optically, and/or coupled via another type of coupling) to one or more external systems, sources, and/or devices (e.g., classical and/or quantum computing devices, communication devices, and/or another type of external system, source, and/or device) using a wire and/or a cable. For example, QITE ansatz system 102 can be coupled (e.g., communicatively, electrically, operatively, optically, and/or coupled via another type of coupling) to one or more external systems, sources, and/or devices (e.g., classical and/or quantum computing devices, communication devices, and/or another type of external system, source, and/or device) using a data cable including, but not limited to, a High-Definition Multimedia Interface (HDMI) cable, a recommended standard (RS) 232 cable, an Ethernet cable, and/or another data cable.

In some embodiments, QITE ansatz system 102 can be coupled (e.g., communicatively, electrically, operatively, optically, and/or coupled via another type of coupling) to one or more external systems, sources, and/or devices (e.g., classical and/or quantum computing devices, communication devices, and/or another type of external system, source, and/or device) via a network. For example, such a network can comprise a wired and/or a wireless network, including, but not limited to, a cellular network, a wide area network (WAN) (e.g., the Internet) or a local area network (LAN). QITE ansatz system 102 can communicate with one or more external systems, sources, and/or devices, for instance, computing devices using virtually any desired wired and/or wireless technology, including but not limited to: wireless fidelity (Wi-Fi), global system for mobile communications (GSM), universal mobile telecommunications system (UMTS), worldwide interoperability for microwave access (WiMAX), enhanced general packet radio service (enhanced GPRS), third generation partnership project (3GPP) long term evolution (LTE), third generation partnership project 2 (3GPP2) ultra mobile broadband (UMB), high speed packet access (HSPA), Zigbee and other 802.XX wireless technologies and/or legacy telecommunication technologies, BLUETOOTH®, Session Initiation Protocol (SIP), ZIGBEE®, RF4CE protocol, WirelessHART protocol, 6LoWPAN (IPv6 over Low power Wireless Area Networks), Z-Wave, an ANT, an ultra-wideband (UWB) standard protocol, and/or other proprietary and non-proprietary communication protocols. Therefore, in some embodiments, QITE ansatz system 102 can comprise hardware (e.g., a central processing unit (CPU), a transceiver, a decoder, quantum hardware, a quantum processor, and/or other hardware), software (e.g., a set of threads, a set of processes, software in execution, quantum pulse schedule, quantum circuit, quantum gates, and/or other software) or a combination of hardware and software that can facilitate communicating information between QITE ansatz system 102 and external systems, sources, and/or devices (e.g., computing devices, communication devices, and/or another type of external system, source, and/or device).

QITE ansatz system 102 can comprise one or more computer and/or machine readable, writable, and/or executable components and/or instructions that, when executed by processor 106 (e.g., a classical processor, a quantum processor, and/or another type of processor), can facilitate performance of operations defined by such component(s) and/or instruction(s). Further, in numerous embodiments, any component associated with QITE ansatz system 102, as described herein with or without reference to the various figures of the subject disclosure, can comprise one or more computer and/or machine readable, writable, and/or executable components and/or instructions that, when executed by processor 106, can facilitate performance of operations defined by such component(s) and/or instruction(s). For example, universal component 108, simulation component 110, and/or any other components associated with QITE ansatz system 102 as disclosed herein (e.g., communicatively, electronically, operatively, and/or optically coupled with and/or employed by QITE ansatz system 102), can comprise such computer and/or machine readable, writable, and/or executable component(s) and/or instruction(s). Consequently, according to numerous embodiments, QITE ansatz system 102 and/or any components associated therewith as disclosed herein, can employ processor 106 to execute such computer and/or machine readable, writable, and/or executable component(s) and/or instruction(s) to facilitate performance of one or more operations described herein with reference to QITE ansatz system 102 and/or any such components associated therewith.

QITE ansatz system 102 can facilitate (e.g., via processor 106) performance of operations executed by and/or associated with universal component 108 and/or simulation component 110. For example, QITE ansatz system 102 can facilitate (e.g., via processor 106): generalizing a quantum imaginary time evolution (QITE) process to provide a quantum imaginary time evolution (QITE) ansatz process; and/or applying the QITE ansatz process to one or more general multi-body quantum systems (also referred to as "general many body quantum systems"). In another example, as described in detail below, QITE ansatz system 102 can further facilitate via processor 106 (e.g., a classical processor, a quantum processor, and/or another type of processor): performing the generalization so that the QITE ansatz process preserves real-valued wavefunctions to enforce a defined property of imaginary time evolution in presence of time reversal symmetry; performing the generalization so that the QITE ansatz process integrates a variational optimization of a step length with the QITE process; employing at least one tensor network to simulate application of the QITE ansatz process to a wavefunction of the one or more general multi-body quantum systems; employing the at least one tensor network to reduce computational costs of a computing device employed to simulate the application; and/or employing the at least one tensor network to provide polynomial scaling under an approximation that a bond dimension of the at least one tensor network remains polynomially scaling with system size. In the above examples, the one or more general multi-body quantum systems can comprise a boson, a fermion, a boson-fermion-spin combination, a molecular system comprising correlated fermions, and/or a lattice system comprising correlated bosons and fermions.

Universal component 108 can generalize a QITE process to provide a QITE ansatz process. For example, universal component 108 can generalize (e.g., extend the application of) a QITE process to provide a new QITE ansatz process that can be applied to one or more general multi-body quantum systems. For instance, universal component 108 can generalize (e.g., extend the application of) a QITE process to provide a new QITE ansatz process that can be applied to one or more general multi-body quantum systems including, but not limited to, a boson, a fermion, a boson-fermion-spin combination, a molecular system comprising correlated fermions, a lattice system comprising correlated bosons and fermions, and/or another general multi-body quantum system.

In an example embodiment, to generalize (e.g., extend the application of) a QITE process to provide a new QITE ansatz process that can be applied to such one or more general multi-body quantum systems defined above, universal component 108 can implement the following construction. Universal component 108 can associate, to a physical system S, a metric space (V, d) of vertices $v \in V$, where V denotes the set of vertices of the graph and d denotes a distance function. To each vertex, universal component 108 can associate a set of orbitals $o_v^i$, $i=1 \ldots N_v$, and to each orbital, universal component 108 can associate a local Hilbert space $H_v^i$ of dimension $d_v^i$ and spin, Bose, Fermi type with a local basis of $d_v^2$ real-valued operators $\hat{G}_m$, where m is an index labeling basis operators on the single-site Hilbert space. In this example embodiment, the Hilbert space of the system is then $H=F(\otimes_{v \in V} \otimes_{i=1}^{N_v} H_v^i)$, where the operator F applies proper symmetrization. In this example embodiment, the k-local operators are represented as linear combinations $\hat{X}=\Sigma_{m_1 \ldots m_k} X^{m_1 \cdots m_k} \hat{G}_{m_1} \ldots \hat{G}_{m_k}$ of basis operators acting on $k < \Sigma_v N_v$ orbitals (e.g., domain of $\hat{X}$) with expansion coefficients $X_{m_1 \ldots m_k}$.

Continuing with the above example embodiment, imaginary-time evolution under a Hamiltonian that is a linear combination of k-local operators can be mapped by universal component 108 onto a product of unitary operators of the form $e^{\hat{X}-\hat{C}^{+}}$. In this example embodiment, universal component 108 can perform the generalization described here to ensure that the QITE ansatz process preserves real-valued wavefunctions to enforce a defined property of imaginary time evolution in presence of time reversal symmetry. For instance, universal component 108 can perform the generalization described here to ensure that wavefunctions remain real-valued along imaginary-time evolution. In this example embodiment, universal component 108 can find expansion coefficients of $\hat{X}$ by solving a linear system of equations. For instance, universal component 108 can solve the linear system using an adaptation of the Davidson diagonalization algorithm, to reduce the scaling from $3^{rd}$ power (e.g., singular-value decomposition, pseudo-inversion approaches) to $2^{nd}$ power in the dimension of the domain of $\hat{X}$.

Additionally, or alternatively, in some embodiments, universal component 108 can perform the above described generalization of the QITE process so that the QITE ansatz process integrates a variational optimization of a step length with the QITE process. For example, universal component 108 can perform the above described generalization of the QITE process so that the QITE ansatz process integrates a variational optimization of a step length with the QITE process to accelerate cooling of a certain system as described below with reference to diagram 600e and FIG. 6E.

It should be appreciated that prior art technologies do not provide and/or implement such a universal scheme (e.g., the QITE ansatz process) to apply QITE to a general (e.g., generic) multi-body quantum system. It should also be appreciated that by providing and/or implementing such a universal scheme (e.g., the QITE ansatz process), QITE ansatz system 102 and/or universal component 108 can provide a form of a unitary operator that enforces reality of wavefunctions and can further provide a more efficient QITE simulation (e.g., compared to prior art QITE simulations) by using the modified Davidson method. An example embodiment of the QITE ansatz process that can be provided by universal component 108 is illustrated as a computer-implemented method 200 described below and depicted in FIG. 2, where a description of how to map physical operators onto qubit operators is also provided to enable translation of local physical operators onto non-local qubit operators.

Simulation component 110 can apply the above described QITE ansatz process, which can be provided by universal component 108, to one or more general multi-body quantum systems. For example, simulation component 110 can apply the above described QITE ansatz process to the one or more general multi-body quantum systems defined above.

In an example embodiment, to apply the above described QITE ansatz process to one or more general multi-body quantum systems, simulation component 110 can simulate such application as described below. For example, simulation component 110 can comprise a quantum simulation application (e.g., software) that can simulate on a classical computer (e.g., a personal computer (PC), a laptop, and/or another type of classical computer) the application of the QITE ansatz process to one or more general multi-body quantum systems. In this example embodiment, simulation component 110 can employ at least one tensor network to simulate application of the QITE ansatz process to a wavefunction of the one or more general multi-body quantum systems defined above. In this example embodiment, simulation component 110 can employ the at least one tensor network to provide polynomial scaling under an approximation that a bond dimension of the at least one tensor network remains polynomially scaling with system size. Consequently, it should be appreciated that simulation component 110 can employ the at least one tensor network to reduce computational cost of a computing device (e.g., classical computer, PC, laptop, and/or another computing device) that can be employed by simulation component 110 to simulate such application of the QITE ansatz process to one or more general multi-body quantum systems. That is, for example, it should be appreciated that reduced polynomial cost, and thus reduced computational cost, can be achieved by QITE ansatz system 102 and/or simulation component 110 when the above parameter referred to as "bond dimension" is sufficiently small.

In an example embodiment, to achieve efficient classical simulation (e.g., via a classical computer) of the QITE process and/or the QITE ansatz process, simulation component 110 can represent wavefunctions and local operator expansion coefficients using tensor networks with a predefined maximum bond dimension B, such that:

$$\Psi^{i_1 \cdots i_N} = \Sigma_{a_1 \cdots a_{N-1}} A_{a_1}{}^{i_1} A_{a_1 a_2}{}^{i_2} \cdots A_{a_{N-1}}{}^{i_N} \text{ and}$$

$$X^{m_1 \cdots m_k} = \Sigma_{b_1 \cdots b_{k-1}} T_{b_1}{}^{m_1} T_{b_1 b_2}{}^{m_2} \cdots T_{b_{N-1}}{}^{m_k}$$

where a and b are indices ranging between 1 and the so-called bond dimension of the tensor network, and A and T are rank-2 or -3 tensors.

It should be appreciated that such representation of wavefunctions and local operator expansion coefficients using such tensor networks reduces the memory involved with storing wavefunctions and local operators from exponential to polynomial in N, k, respectively.

To execute such classical simulation of the QITE process and/or the QITE ansatz process, simulation component 110 can perform Operations (i), (ii), and (iii) defined below using tensor network contractions.

Operation (i): compute (e.g., via processor 106) $X^{m_1 \cdots m_k} = \langle \Phi | \hat{G}_{m_1} \cdots \hat{G}_{m_k} | \Psi \rangle$ Operation (ii): compute (e.g., via processor 106) $\hat{X}|\psi\rangle$ Operation (iii): compute (e.g., via processor 106) $\hat{X}^+$ As described above, simulation component 110 can perform Operations (i), (ii), and/or (iii) using tensor contractions, where such tensor contractions are described below and illustrated in the example embodiments depicted in FIGS. 3A, 3B, 4, and 5. Simulation component 110 can further apply a Fermi operator acting on orbital i by a quantum-based algorithm, in which an ancillary orbital is added to the system, filled with the parity of all the Fermi orbitals preceding i.

It should be appreciated that prior art technologies that simulate the QITE process on a classical computer use full-rank tensors, as opposed to tensor networks used by simulation component 110 as described herein. It should also be appreciated that QITE ansatz system 102 and/or simulation component 110 enable benchmarking the QITE process and/or the QITE ansatz process on larger physical systems by controllable and systematically improvable (e.g., via increasing B) classical simulations (e.g., simulations executed on a classical computer), without resorting to complicated and expensive hardware experiments (e.g., experiments using quantum hardware and/or quantum circuits).

In some embodiments, QITE ansatz system 102 can be associated with a cloud computing environment. For example, QITE ansatz system 102 can be associated with cloud computing environment 950 described below with reference to FIG. 9 and/or one or more functional abstraction layers described below with reference to FIG. 10 (e.g., hardware and software layer 1060, virtualization layer 1070, management layer 1080, and/or workloads layer 1090).

QITE ansatz system 102 and/or components thereof (e.g., universal component 108, simulation component 110, and/or another component) can employ one or more computing resources of cloud computing environment 950 described below with reference to FIG. 9 and/or one or more functional abstraction layers (e.g., quantum software) described below with reference to FIG. 10 to execute one or more operations in accordance with one or more embodiments of the subject disclosure described herein. For example, cloud computing environment 950 and/or such one or more functional abstraction layers can comprise one or more classical computing devices (e.g., classical computer, classical processor, virtual machine, server, and/or another classical computing device), quantum hardware, and/or quantum software (e.g., quantum computing device, quantum computer, quantum processor, quantum circuit simulation software, superconducting circuit, and/or other quantum hardware and/or quantum software) that can be employed by QITE ansatz system 102 and/or components thereof to execute one or more operations in accordance with one or more embodiments of the subject disclosure described herein. For instance, QITE ansatz system 102 and/or components thereof can employ such one or more classical and/or quantum computing resources to execute one or more classical and/or quantum: mathematical function, calculation, and/or equation; computing and/or processing script; algorithm; model (e.g., artificial intelligence (AI) model, machine learning (ML) model, and/or another type of model); and/or another operation in accordance with one or more embodiments of the subject disclosure described herein.

It is to be understood that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported, providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure that includes a network of interconnected nodes.

Figure 2:
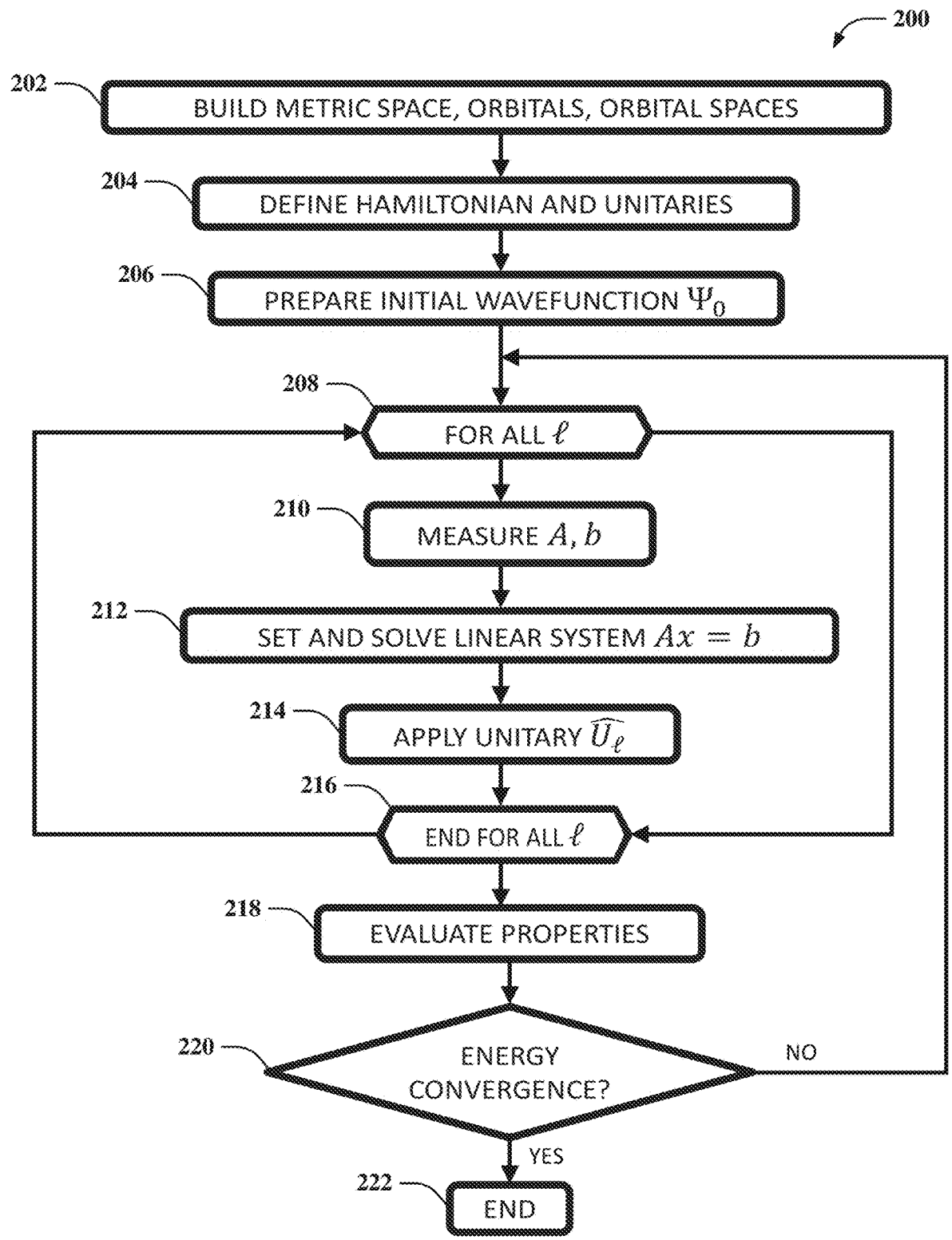
FIG. 2 illustrates a flow diagram of an example, non-limiting computer-implemented method that can facilitate generalization of a quantum imaginary time evolution process and simulation by tensor networks in accordance with one or more embodiments described herein.

FIG. 2 illustrates a flow diagram of an example, non-limiting computer-implemented method 200 that can facilitate generalization of a quantum imaginary time evolution process and simulation by tensor networks in accordance with one or more embodiments described herein. Repetitive description of like elements and/or processes employed in respective embodiments is omitted for sake of brevity.

Computer-implemented method 200 can comprise a generalized QITE process simulation (e.g., a QITE ansatz process simulation) that can be executed by QITE ansatz system 102 via universal component 108 and simulation component 110 to implement $$|\Psi_0\rangle \mapsto \lim_{\beta \to \infty} e^{-\beta \hat{H}} |\Psi_0\rangle / \| e^{-\beta \hat{H}} \Psi_0 \|.$$

Operations 202 and 208-218 of computer-implemented method 200 can comprise generalization operations that can be performed by universal component 108 as described above with reference to FIG. 1 and below with reference to such operations.

At 202, computer-implemented method 200 can comprise building (e.g., via QITE ansatz system 102 and/or universal component 108 using processor 106) metric space, orbitals, and/or orbital spaces. For example, as described above with reference to the example embodiment depicted in FIG. 1, universal component 108 can associate, to a physical system S, a metric space (V, d) of vertices v∈V. To each vertex, universal component 108 can associate a set of orbitals $o_v^i$, i=1 ... $N_v$, and to each orbital, universal component 108 can associate a local Hilbert space $H_v^i$ of dimension $d_v^i$ and spin, Bose, Fermi type with a local basis of $d_v^{i^2}$ real-valued operators $\hat{G}_m$.

At 204, computer-implemented method 200 can comprise defining (e.g., via QITE ansatz system 102 and/or simulation component 110 using processor 106) a Hamiltonian and unitaries (e.g., unitary operators of the form $e^{\hat{X}-\hat{X}^+}$). For example, QITE ansatz system 102 and/or simulation component 110 can define (e.g., using processor 106) the below Hamiltonian and unitary operators.

$$\hat{H} = \sum_\ell \hat{h}_\ell \cdot, \hat{h}_\ell = \hat{h}_\ell |_{D(\ell)} \otimes \hat{h}_\ell |_{D(\ell)}$$

$$\hat{U} = \prod_\ell \hat{U}_\ell \cdot, \hat{U}_\ell = \hat{U}_{\ell_{N(\ell)}} \otimes \hat{U}_\ell |_{N(\ell)}, D(\ell) \subseteq N(\ell)$$

$$\hat{U}_\ell = e^{\hat{A}_\ell - \hat{A}_\ell^+}, \hat{A}_\ell = \sum_M x_M \hat{G}_M,$$

where l is an index labeling local terms of the Hamiltonian and unitaries in the circuit, $\hat{h}_\ell$, $\hat{U}_\ell$ denote local terms of the Hamiltonian and unitaries of the circuit, D($\ell$) is the domain of a local operator $\hat{h}_\ell$ and N($\ell$) is the domain of a local unitary.

At 206, computer-implemented method 200 can comprise preparing (e.g., via QITE ansatz system 102 and/or simulation component 110 using processor 106) initial wavefunction $\Psi_0$.

At 208, computer-implemented method 200 can comprise, for all $\ell$, iteratively performing (e.g., via QITE ansatz system 102 and/or universal component 108 using processor 106) operations 210, 212, and 214 described below until energy convergence is achieved as described below with reference to operations 218 and 220. To perform operations 210, 212, and 214 described below, universal component 108 can use the following equations and/or parameters.

$$A_{MN} = \langle \Psi | (\hat{G}_M - \hat{G}_M^+)(\hat{G}_N - \hat{G}_N^+) | \Psi \rangle$$

$$b_M = \langle \Psi | e^{-\Delta \tau \hat{h}_\ell} (\hat{G}_M - \hat{G}_M^+) | \Psi \rangle,$$

where $\Delta\tau$ denotes a single imaginary-time step.

For variational QITE, universal component 108 can apply:

$$\hat{V}(t) = e^{t(\hat{A}_\ell - \hat{A}_\ell^+)}, t = \operatorname{argmin} \langle \Psi | \hat{V}(t)^+ \hat{H} \hat{V}(t) | \Psi \rangle$$

For standard QITE, universal component 108 can use t=1.

At 210, computer-implemented method 200 can comprise, for all l, measuring (e.g., via QITE ansatz system 102 and/or universal component 108 using processor 106) A, b.

At 212, computer-implemented method 200 can comprise, for all l, setting and solving (e.g., via QITE ansatz system 102 and/or universal component 108 using processor 106) linear system Ax=b, where x denotes a vector.

At 214, computer-implemented method 200 can comprise, for all l, applying (e.g., via QITE ansatz system 102 and/or universal component 108 using processor 106) unitary $\widehat{U_\ell}$.

At 216, computer-implemented method 200 can comprise, for all E, ending (e.g., via QITE ansatz system 102 and/or universal component 108 using processor 106) operations 210, 212, and 214.

At 218, computer-implemented method 200 can comprise evaluating (e.g., via QITE ansatz system 102 and/or simulation component 110 using processor 106) properties.

At 220, computer-implemented method 200 can comprise determining (e.g., via QITE ansatz system 102 and/or simulation component 110 using processor 106) whether there is energy convergence.

If it is determined at operation 220 that there is not energy convergence, computer-implemented method 200 can comprise returning to operation 208 to perform operations 208-218 until it is determined at operation 220 that there is energy convergence.

If it is determined at operation 220 that there is energy convergence, at 222, computer-implemented method 200 can comprise ending.

FIGS. 3A and 3B illustrate example, non-limiting diagrams 300a and 300b, respectively, that can facilitate generalization of a quantum imaginary time evolution process and simulation by tensor networks in accordance with one or more embodiments described herein. Repetitive description of like elements and/or processes employed in respective embodiments is omitted for sake of brevity.

Diagram 300a depicted in FIG. 3A is a visual representation of how simulation component 110 can perform Operation (i) described above with reference to FIG. 1 to compute $X^{m_1 \cdots m_k} = \langle \Phi | \hat{G}_{m_1} \ldots \hat{G}_{m_k} | \Psi \rangle$ using tensor networks. As illustrated in the example embodiment depicted in FIG. 3A, diagram 300a comprises steps 1-6, where each step is a visual representation of a mathematical operation that can be performed by simulation component 110 to compute $X^{m_1 \cdots m_k} = \langle \Phi | \hat{G}_{m_1} \ldots \hat{G}_{m_k} | \Psi \rangle$ using tensor networks. In this example embodiment, as described in detail below, simulation component 110 can: select tensors to contract (e.g., components of the expression $X^{m_1 \cdots m_k} = \langle \Phi | \hat{G}_{m_1} \ldots \hat{G}_{m_k} | \Psi \rangle$ that will be contracted by simulation component 110); contract the selected tensors; insulate the result from the remaining steps of the computation; and/or produce the result.

In the example embodiment depicted in FIG. 3A: blocks 302a, 302b, 302c can comprise tensors that represent ket, bra, and local basis (e.g., blocks 302a, 302b, 302c represent quantities to be contracted); blocks 304 represent tensors being contracted in each step; blocks 306 represent tensors that have been contracted in a previous step; dashed lines 308 indicate singular value decomposition, separating indices before further contraction; and triangles 310 can comprise tensors representing $X^{m_1 \cdots m_k}$ (e.g., triangles 310 can represent the output product of the computation that can be insulated from the rest of the computation steps as represented by dashed lines 308). As illustrated in the example embodiment depicted in FIG. 3A: at step 1, simulation component 110 can select and contract blocks 304 to produce block 306 depicted in step 2; at step 2, simulation component 110 can separate indices before further contraction, as represented by dashed line 308; and at step 3, simulation component 110 can produce the first part of the result, as represented by triangle 310 depicted in step 3. In steps 4, 5, and 6, simulation component 110 can repeat the above described operations of steps 1, 2, and 3 to produce the result of the computation represented by triangles 310 in step 6.

In Operation (i), when Fermionic orbitals are present, in order to apply an operator on orbital k, simulation component 110 can take into account occupation numbers of orbitals up to k−1. To do this, simulation component 110 can use a quantum-based algorithm illustrated in diagram 300b of FIG. 3B in which an ancillary 2-level system (represented by blocks 302c in FIG. 3B) prepared in a state $|0\rangle$ is coupled to a tensor network (represented by blocks 302a and dashed line 312 in FIG. 3B) representing the state $\Psi$, simulation component 110 can flip its value according to the occupation number of orbitals 1 to k−1 and swap it below orbital k. Simulation component 110 can then apply an extended operator (e.g., linear combination of $I \otimes I$, $\hat{c} \otimes Z$, $\hat{c}^+ \otimes Z$, $\hat{c}^+ \hat{c} \otimes I$ for a spinless Fermi orbital, where I denotes the identity operator, $\hat{c}$ denotes the destruction operator of a fermion, $\hat{c}^+$ denotes the creation operator of a fermion and Z denotes the Pauli Z operator), and simulation component 110 can further uncompute the ancilla.

Figure 4:
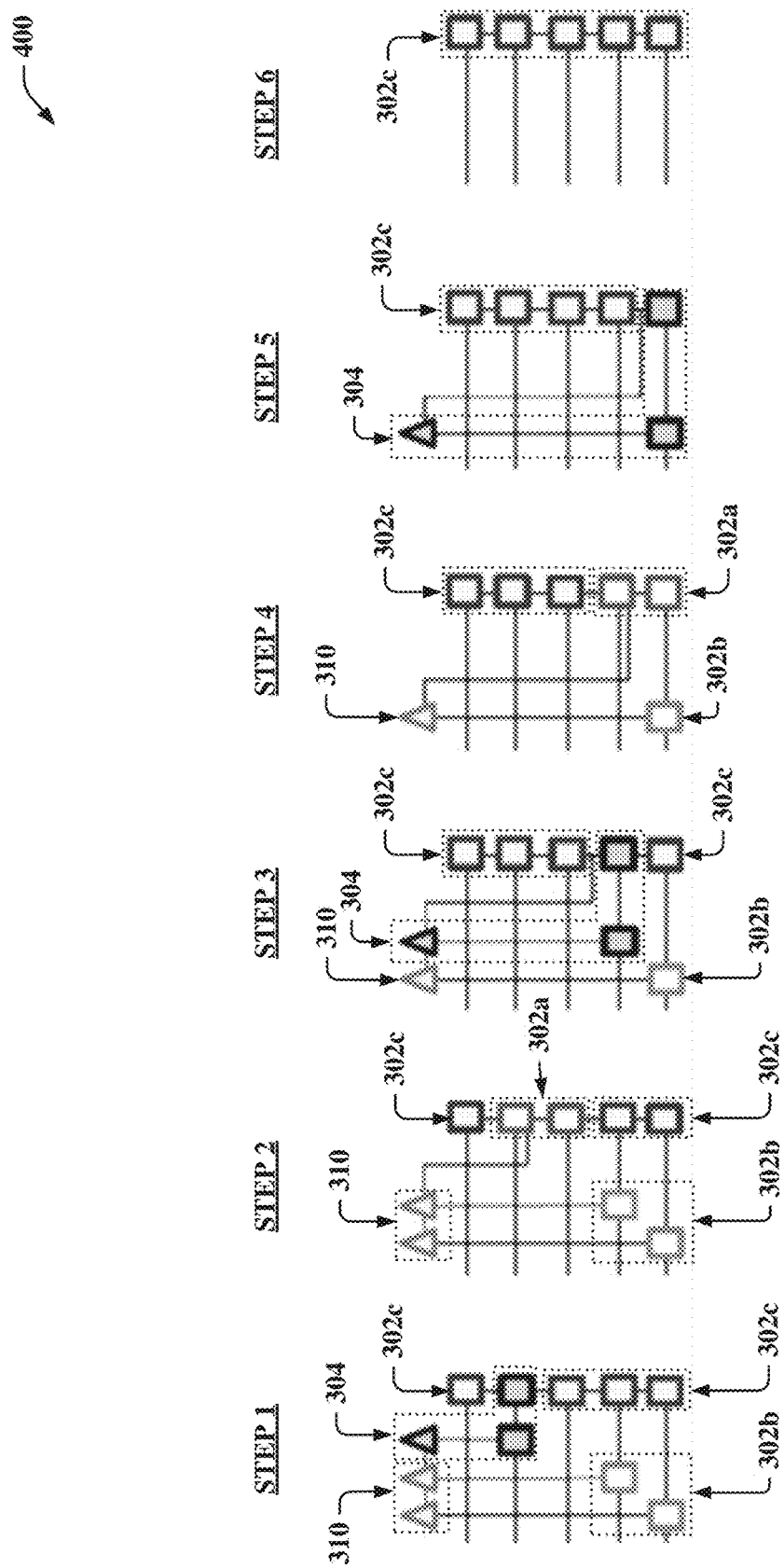
FIG. 4 illustrates an example, non-limiting diagram that can facilitate generalization of a quantum imaginary time evolution process and simulation by tensor networks in accordance with one or more embodiments described herein.

FIG. 4 illustrates an example, non-limiting diagram 400 that can facilitate generalization of a quantum imaginary time evolution process and simulation by tensor networks in accordance with one or more embodiments described herein. Repetitive description of like elements and/or processes employed in respective embodiments is omitted for sake of brevity.

Diagram 400 is a visual representation of how simulation component 110 can perform Operation (ii) described above with reference to FIG. 1 to compute $\hat{X}|\Psi\rangle$ using tensor networks. As illustrated in the example embodiment depicted in FIG. 4, diagram 400 comprises steps 1-6, where each step is a visual representation of a mathematical operation that can be performed by simulation component 110 to compute $\hat{X}|\Psi\rangle$ using tensor networks. The mathematical sequence representation illustrated in diagram 400 can comprise an example, non-limiting alternative embodiment of the mathematical sequence representation illustrated in diagram 300a described above with reference to FIG. 3A, where blocks 302a in diagram 400 represent tensors selected for the "swap and singular value decomposition" operation $\Sigma_b A_{amb}{}^x A_{bc}{}^y = U_{amc}{}^{xy} = \Sigma_{bd} A_{ab}{}^x A_{bd}{}^y X_{dc}{}^m$.

Figure 5:
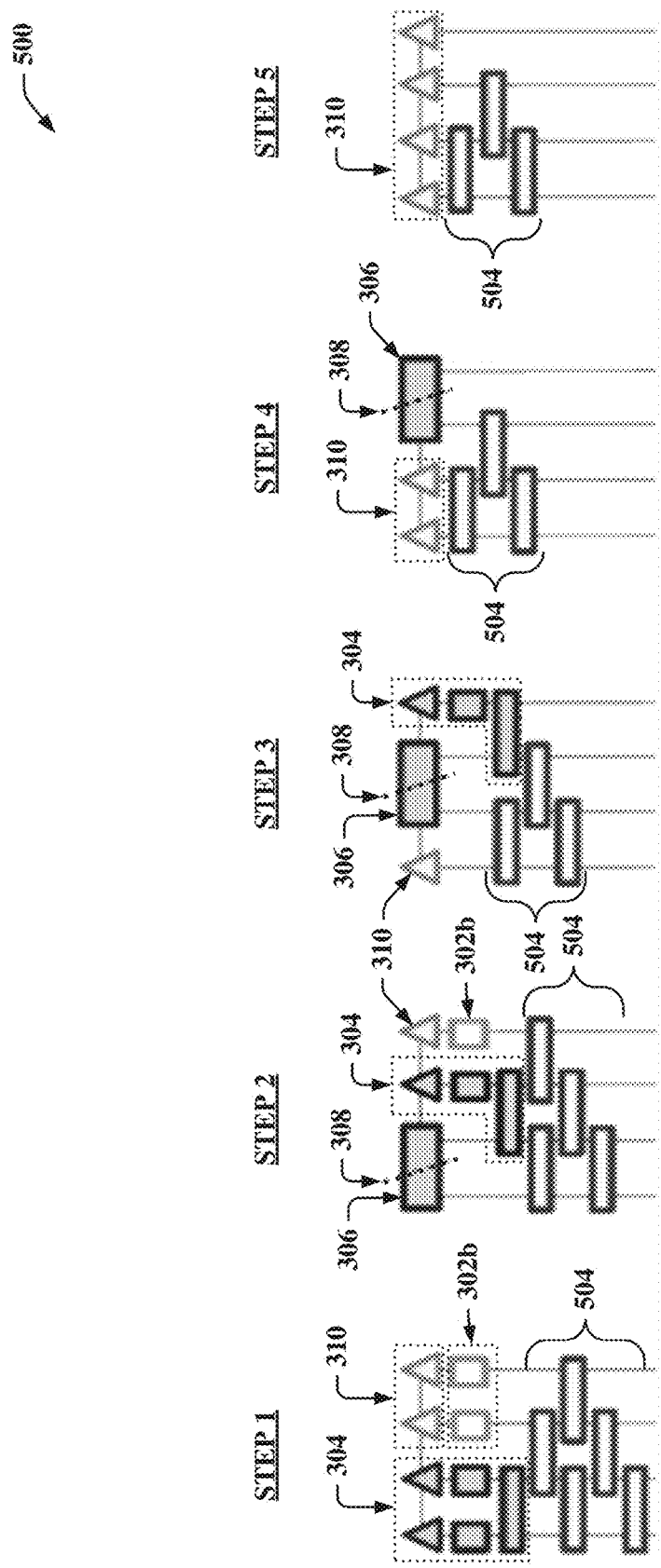
FIG. 5 illustrates an example, non-limiting diagram that can facilitate generalization of a quantum imaginary time evolution process and simulation by tensor networks in accordance with one or more embodiments described herein.

FIG. 5 illustrates an example, non-limiting diagram 500 that can facilitate generalization of a quantum imaginary time evolution process and simulation by tensor networks in accordance with one or more embodiments described herein. Repetitive description of like elements and/or processes employed in respective embodiments is omitted for sake of brevity.

Diagram 500 is a visual representation of how simulation component 110 can perform Operation (iii) described above with reference to FIG. 1 to compute $\hat{X}^+$ using tensor networks. Diagram 500 can comprise a visual representation of how simulation component 110 can take the adjoint of an operator. As illustrated in the example embodiment depicted in FIG. 5, diagram 500 comprises steps 1-5, where each step is a visual representation of a mathematical operation that can be performed by simulation component 110 to compute $\hat{X}^+$ using tensor networks. The mathematical sequence representation illustrated in diagram 500 can comprise an example, non-limiting alternative embodiment of the mathematical sequence representations illustrated in diagram 300a and/or diagram 400 described above with reference to FIGS. 3A and 4, respectively, where blocks 302b in diagram 500 represent adjunction of single-orbital basis operators, $\hat{G}_m^+ = \Sigma_n X_{mn} \hat{G}_n$, and blocks 302c to operators introducing anticommutation signs between Fermi operators. For compactness and clarity, only the initial contractions are shown in FIG. 5.

FIGS. 6A-6G illustrate example, non-limiting diagrams 600a-600g that demonstrate experimental generalization of a quantum imaginary time evolution process and simulation by tensor networks in accordance with one or more embodiments described herein. Repetitive description of like elements and/or processes employed in respective embodiments is omitted for sake of brevity.

Diagrams 600a, 600b, 600c, and 600d correspond to a numerical experiment (e.g., a simulation) demonstrating the application of the QITE ansatz process in accordance with one or more embodiments of the subject disclosure to a system of spin-1/2 particles providing a minimal model of a molecular magnet (e.g., a single molecule magnet such as, for instance, $Mn_{12}$-acetate). As illustrated in diagrams 600a, 600b, 600c, and 600d, the implementation of the QITE ansatz process in accordance with one or more embodiments of the subject disclosure is documented by the decrease of the energy E(β) as a function of imaginary time, towards the ground-state energy. As further illustrated in diagrams 600a, 600b, 600c, and 600d, the implementation of the QITE ansatz process in accordance with one or more embodiments of the subject disclosure involves computation of other ground state properties using dedicated subroutines as the imaginary time evolution unfolds, particularly spin densities $s_i(\beta) = \langle {}_\beta|\hat{S}_i|\Psi_\beta\rangle$ and von Neumann entropies $S(\rho_{ij}) = -Tr[\rho_{ij} \log(\rho_{ij})]$ with $\rho_{ij} = Tr_{k \neq ij}[|\Psi_\beta\rangle\langle\Psi_\beta|]$ to reveal entanglement patterns, where $\hat{S}_i$ denotes the spin at site i.

Figure 6A:
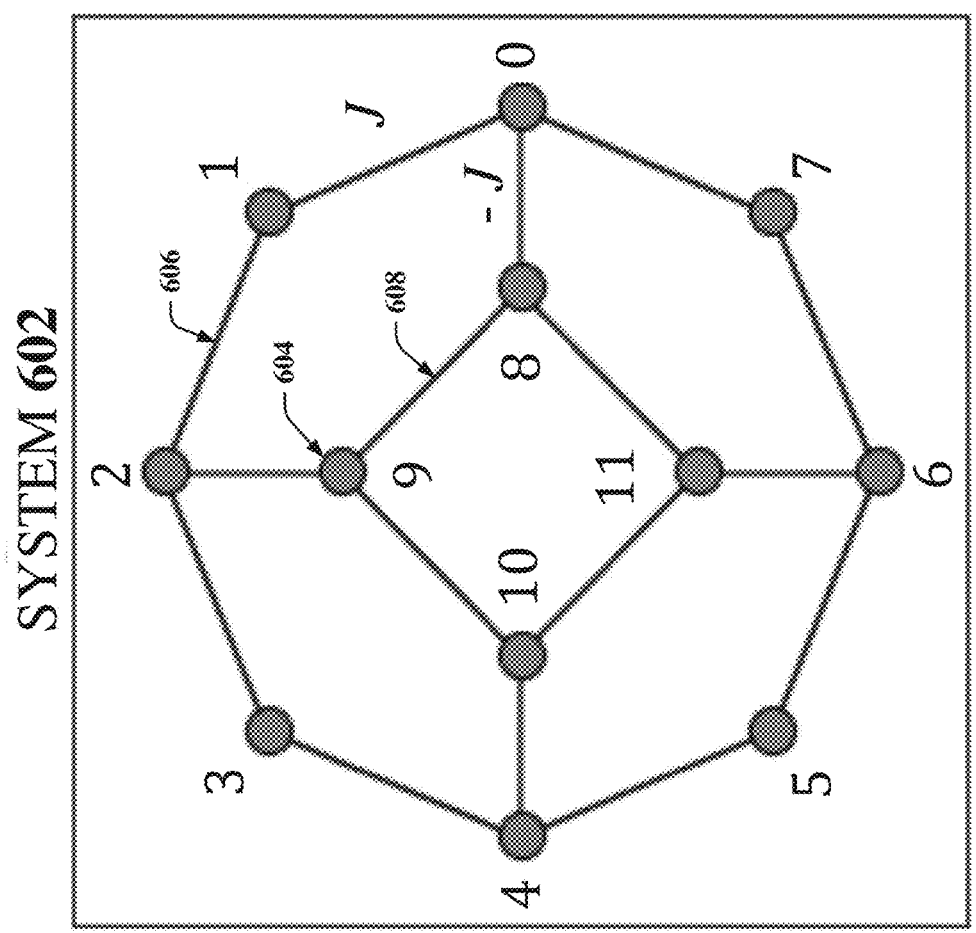
FIGS. 6A-6G illustrate example, non-limiting diagrams that demonstrate experimental generalization of a quantum imaginary time evolution process and simulation by tensor networks in accordance with one or more embodiments described herein.

Diagram 600a of FIG. 6A illustrates the example system 602 to which the QITE ansatz process of the subject disclosure was applied (e.g., via simulation) in accordance with one or more embodiments described herein to produce the example experimental results depicted in diagrams 600b, 600c, and 600d. As illustrated in the example diagram 600a depicted in FIG. 6A, system 602 can comprise a system of spin-1/2 particles 604 providing an example single molecule magnet system (e.g., $Mn_{12}$-acetate). In this example, each of such spin-1/2 particles 604 has a designated number associated therewith (e.g., numbers 0-11 in diagram 600a). In this example, spin-1/2 particles 604 can be represented as qubits. In this example, the coupling energy between any given pair of spin-1/2 particles 604 is denoted as J or −J in diagram 600a. As illustrated in the example diagram 600a depicted in FIG. 6A, spin-1/2 particles 604 denoted as numbers 0, 1, 2, 3, 4, 5, 6, and 7 make up an outer ring 606 of system 602, while spin-1/2 particles 604 denoted as numbers 8, 9, 10, and 11 make up an inner ring 608 of system 602.

Figure 6B:
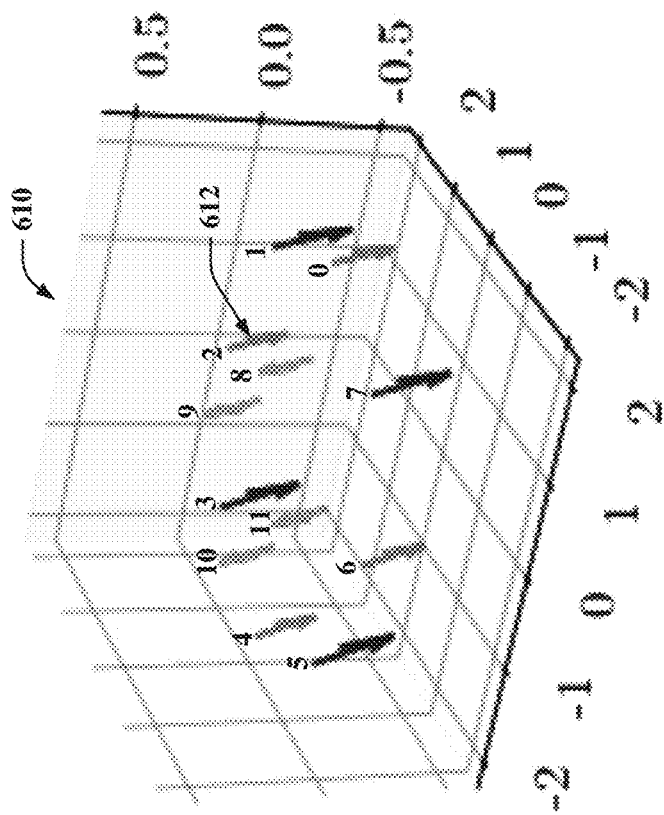
Figure 6B:
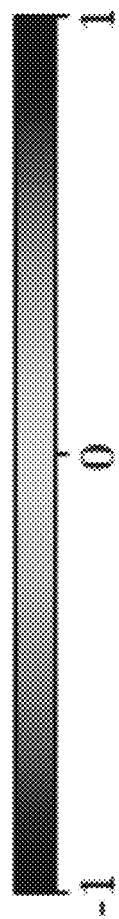

Diagram 600b of FIG. 6B comprises an average spins plot 610 that illustrates the average spins 612 of spin-1/2 particles 604 of system 602 in a multi-dimensional real space (e.g., a 3-dimensional real space) when the QITE ansatz process of the subject disclosure is applied to system 602 in accordance with one or more embodiments described herein. In the example diagram 600b, average spins 612 comprise visual representations of the magnetic properties of system 602. In this example, the number designations 0-11 next to each of average spins 612 correspond to the number designations assigned to spin-1/2 particles 604 depicted in diagram 600a. As illustrated in diagram 600b, outer ring 606 comprising spin-1/2 particles 604 denoted as numbers 0, 1, 2, 3, 4, 5, 6, and 7 has average spins 612 pointing downwards, while inner ring 608 comprising spin-1/2 particles 604 denoted as numbers 8, 9, 10, and 11 has average spins 612 pointing upwards. In this example, it should be appreciated that the upward direction of average spins 612 in inner ring 608 and the downward direction of average spins 612 in outer ring 606 indicate that the coupling between certain spin-1/2 particles 604 of outer ring 606 and certain spin-1/2 particles 604 of inner ring 608 is an anti-ferromagnetic coupling. It should also be appreciated that application of the QITE ansatz process of the subject disclosure to system 602 can enable observation of such ferromagnetic properties of system 602, whereas existing prior art technologies that implement only the QITE process do not enable such observation.

Figure 6C:
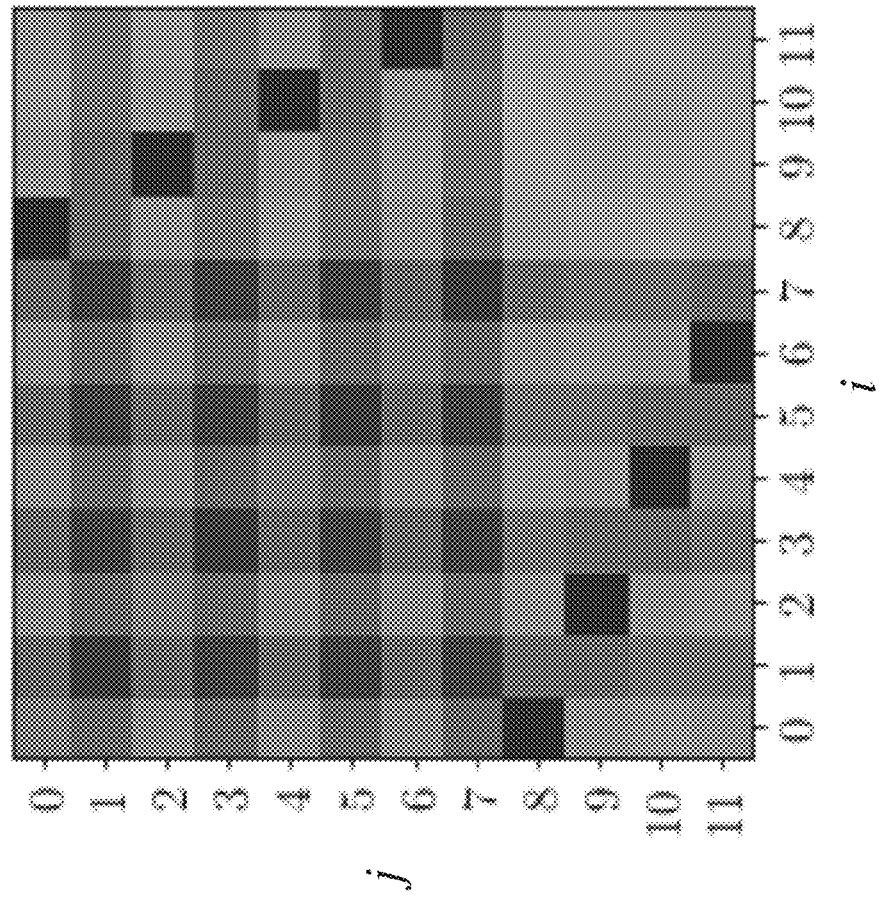

Diagram 600c of FIG. 6C comprises an entanglement matrix 614 that illustrates the measure of electronic correlation between spin-1/2 particles 604 in system 602 (e.g., the entanglement of spin-1/2 particles 604 in system 602). For example, entanglement matrix 614 illustrates how the electronic properties of one or more spin-1/2 particles 604 are influenced by the electronic properties of one or more other spin-1/2 particles 604 in system 602. In the example diagram 600c illustrated in FIG. 6C, the numbers 0 to 11 denoted along the i-rows and the j-columns of entanglement matrix 614 correspond to the number designations assigned to spin-1/2 particles 604 depicted in diagram 600a. In this example, diagram 600c illustrates the entanglement of any one certain spin-1/2 particle 604 in system 602 with one or more other spin-1/2 particles 604 in system 602, where the magnitude of such entanglement is depicted as varying shades of gray corresponding to varying entanglement magnitudes ranging from 0.00 to 1.00 (e.g., ranging from 0 percent (%) to 100% of a certain entanglement value associated with system 602). It should be appreciated that application of the QITE ansatz process of the subject disclosure to system 602 can enable observation of such electronic properties (e.g., entanglement properties) of system 602, whereas existing prior art technologies that implement only the QITE process do not enable such observation.

Figure 6D:
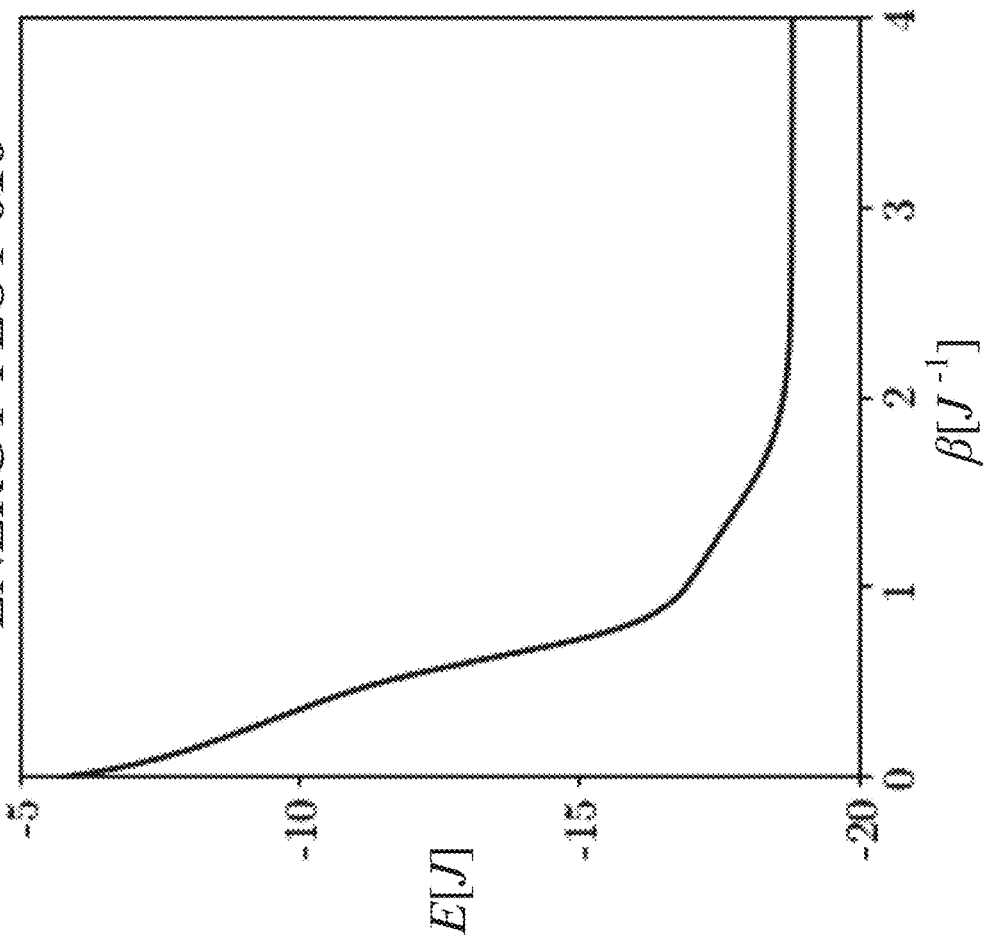

Diagram 600d of FIG. 6D comprises an energy plot 616 that illustrates the cooling of system 602 and/or spin-1/2 particles 604 when the QITE ansatz process of the subject disclosure is applied to system 602 in accordance with one or more embodiments described herein. The X-axis of energy plot 616 denotes the inverse of the temperature ($\beta=1/T$) of system 602 and/or spin-1/2 particles 604 as a function of the inverse of the coupling energy between spin-1/2 particles 604 ($\beta[J^{-1}]$), while the Y-axis of energy plot 616 denotes the energy of system 602 and/or spin-1/2 particles 604 as a function of the coupling energy between spin-1/2 particles 604 (E[J]). With reference to the example diagram 600b illustrated in FIG. 6b and the example diagram 600d depicted in FIG. 6D, system 602 and/or spin-1/2 particles 604 can be cooled to a temperature that enables a configuration of system 602 where the spins of spin-1/2 particles 604 are aligned in a parallel manner or an anti-parallel manner with respect to one another (e.g., as illustrated by average spins 612 in diagram 600b).

Figure 6E:
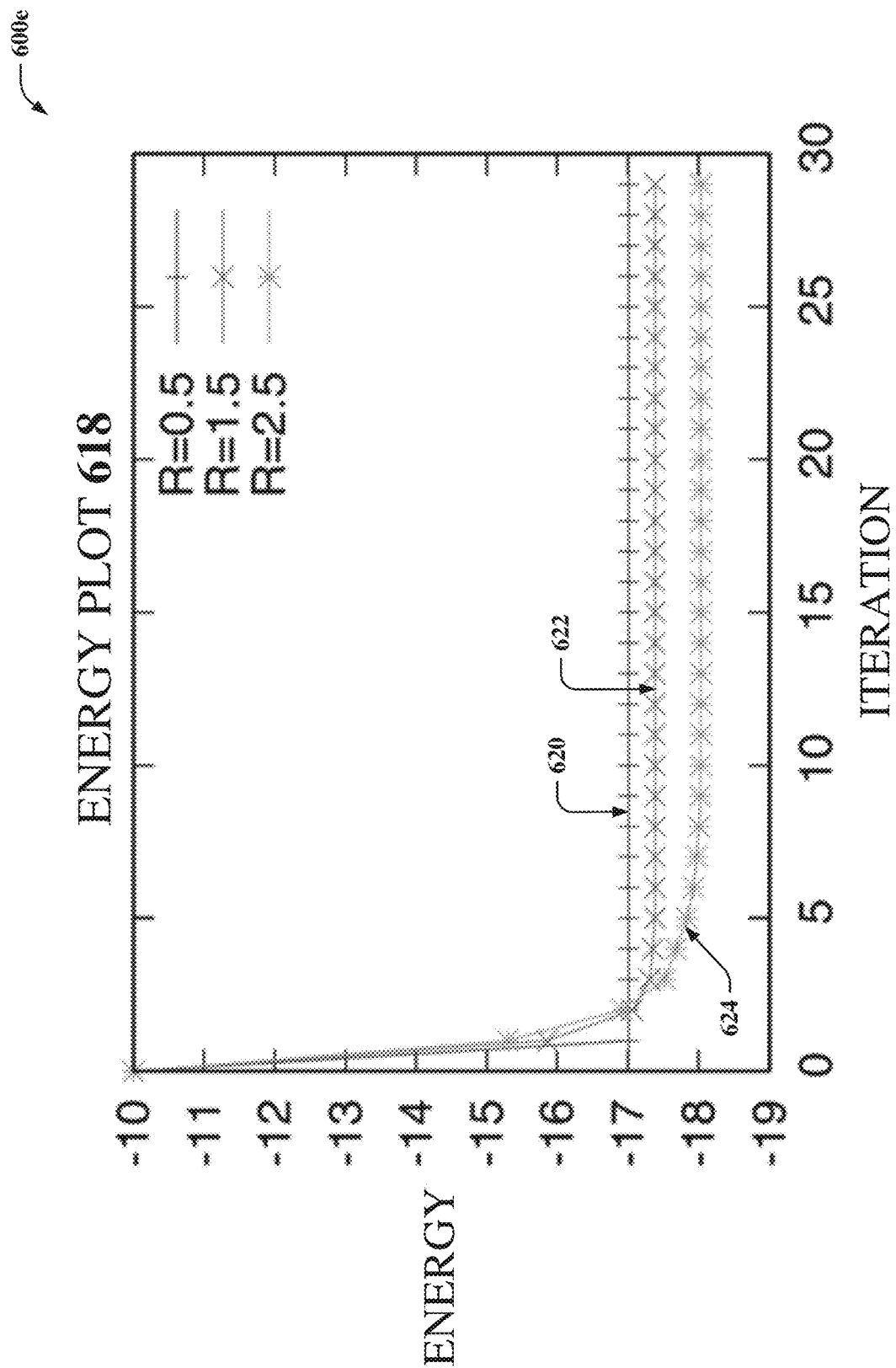

Diagram 600e of FIG. 6E corresponds to a numerical experiment (e.g., a simulation) demonstrating the application of a variational QITE process to a Heisenberg model in accordance with one or more embodiments of the subject disclosure. Diagram 600e comprises an energy plot 618 that illustrates how such application of a variational QITE process to a Heisenberg model in accordance with one or more embodiments of the subject disclosure enables monotonic decrease of the energy of system 602. For instance, in the example diagram 600e depicted in FIG. 6E, curve 620 that corresponds to a radius R=0.5 (e.g., where radius R=0.5 defines a region on the system to be cooled) illustrates how application of a variational QITE process to a Heisenberg model can accelerate the cooling of a certain region of the system such that the cooling occurs in a single step (e.g., a single iteration) of imaginary time evolution. In this example, curve 622 and curve 624 that respectively correspond to a radius of R=1.5 and a radius of R=2.5 illustrate similar accelerated cooling as that of curve 620 except curves 622 and 624 correspond to cooling of larger regions of the system concurrently (e.g., regions of the system defined by a radius of R=1.5 and a radius of R=2.5, respectively). It should be appreciated that application of such a variational QITE process to a Heisenberg model in accordance with one or more embodiments of the subject disclosure can enable energy convergence of the system in fewer iterations (e.g., 1 iteration, 5 iterations, and 12 iterations for curves 620, 622, and 624, respectively), whereas such energy convergence observed in existing prior art technologies that implement only the QITE process involves far more iterations (e.g., approximately 100 iterations or more).

Figure 6F:
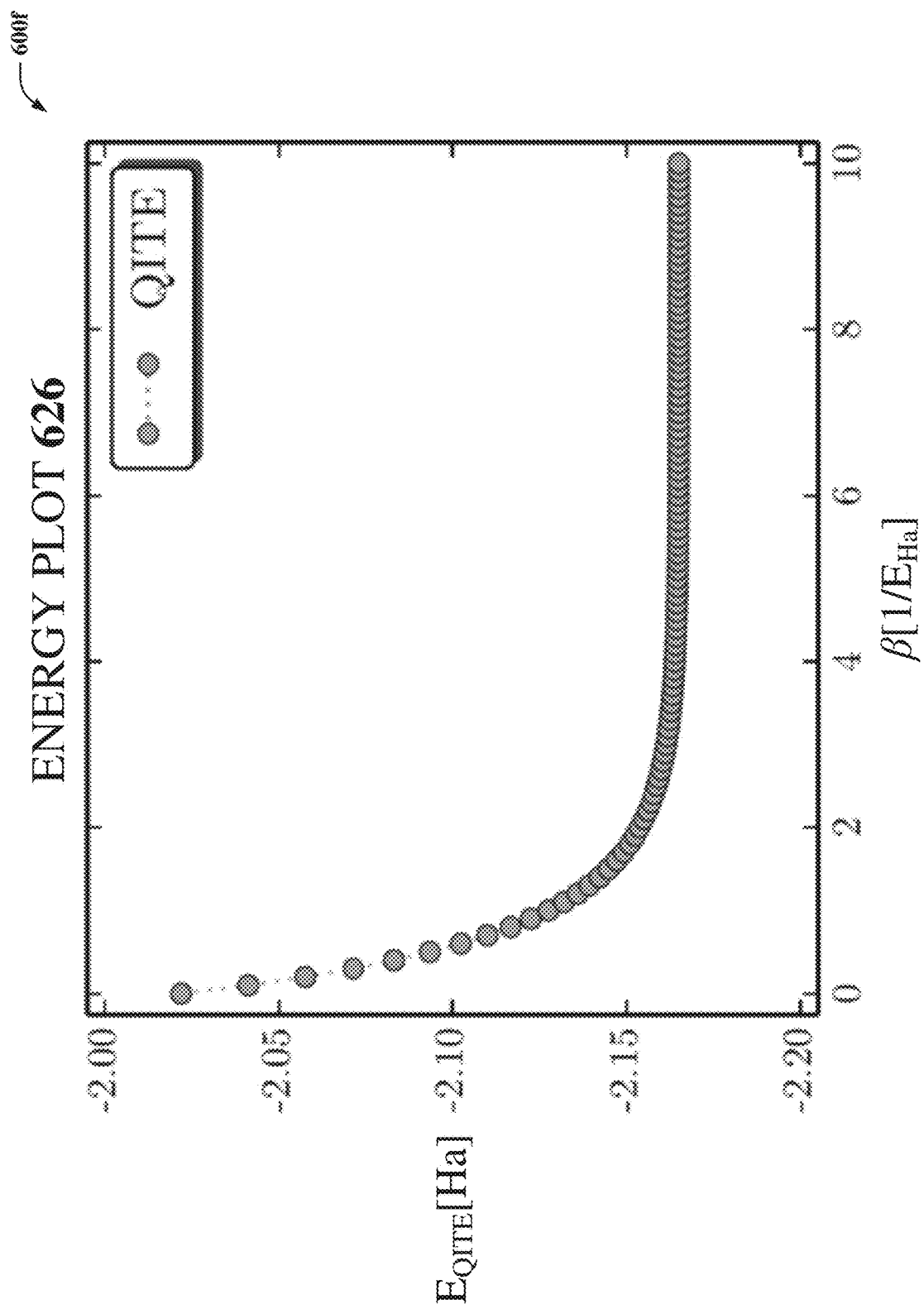
Figure 6G:
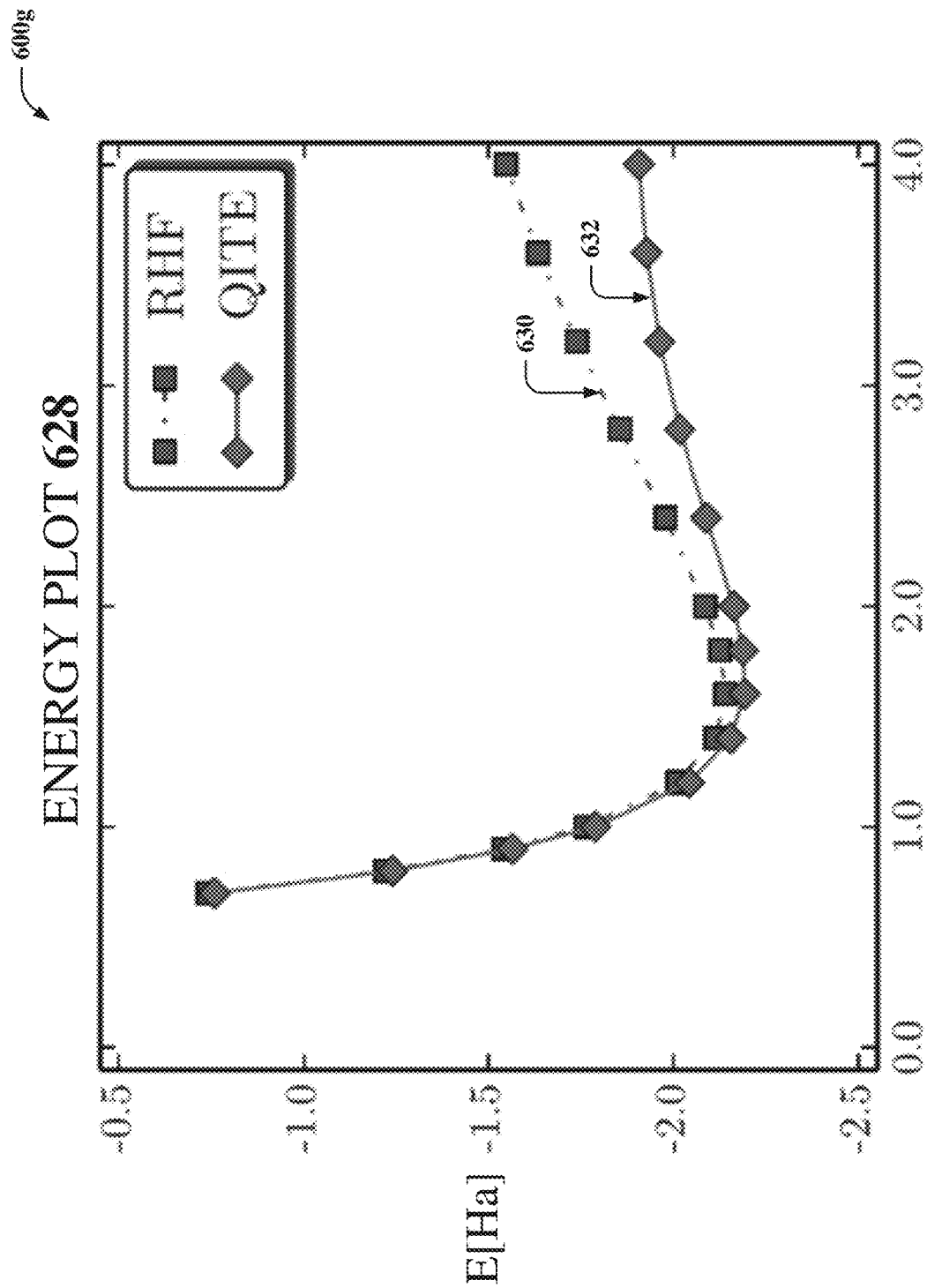

Diagrams 600f and 600g of FIGS. 6F and 6G, respectively, correspond to numerical experiments (e.g., simulations) demonstrating the application of the QITE ansatz process to a chain of four (4) hydrogen (H) atoms (4H atoms) in accordance with one or more embodiments of the subject disclosure. That is, for instance, diagrams 600f and 600g correspond to numerical experiments demonstrating the extension of the QITE process to Fermionic degrees of freedom (e.g., by using the QITE ansatz process of the subject disclosure). In these experiments, the 4H atoms comprise a model system featuring relatively strong electronic correlation of diverse nature, studied as a STO-6G basis set.

Diagram 600f of FIG. 6F comprises an energy plot 626 that illustrates the energy of the 4H atom system as a function of distance (e.g., expressed in atomic units) between each of the 4H atoms. The X-axis of energy plot 626 denotes the inverse of the temperature ($\beta=1/T$) of the 4H atom system as a function of the inverse of the energy of the 4H atom system ($\beta[1/E_{Ha}]$), while the Y-axis of energy plot 626 denotes the energy of the 4H atom system ($E_{QITE}$ [Ha]).

Diagram 600g of FIG. 6G comprises an energy plot 628 having curves 630 and 632 that illustrate the energy of the 4H atom system as a function of distance between each of the 4H atoms. The X-axis of energy plot 628 denotes the energy (E[Ha]) of the 4H atom system, while the Y-axis of energy plot 628 denotes the distance (e.g., expressed in atomic units) between each of the 4H atoms ($R[a_{\bar{B}}]$).

Figure 7:
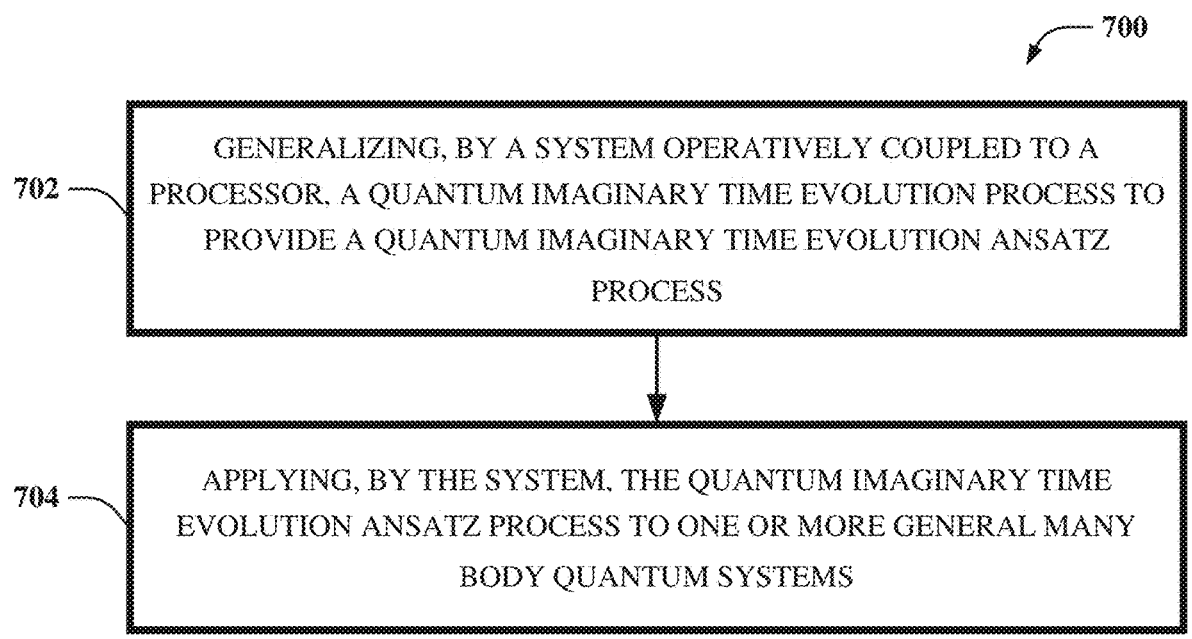
FIG. 7 illustrates a flow diagram of an example, non-limiting computer-implemented method that can facilitate generalization of a quantum imaginary time evolution process and simulation by tensor networks in accordance with one or more embodiments described herein.

FIG. 7 illustrates a flow diagram of an example, non-limiting computer-implemented method 700 that can facilitate generalization of a quantum imaginary time evolution process and simulation by tensor networks in accordance with one or more embodiments described herein. Repetitive description of like elements and/or processes employed in respective embodiments is omitted for sake of brevity.

At 702, computer-implemented method 700 can comprise generalizing, by a system (e.g., via QITE ansatz system 102 and/or universal component 108) operatively coupled to a processor (e.g., processor 106), a quantum imaginary time evolution process to provide a quantum imaginary time evolution ansatz process. For example, universal component 108 can generalize the QITE process to provide the QITE ansatz process as described above with reference to the example embodiments illustrated in FIGS. 1 and 2.

At 704, computer-implemented method 700 can comprise applying, by the system (e.g., via QITE ansatz system 102 and/or simulation component 110), the quantum imaginary time evolution ansatz process to one or more general multi-body quantum systems (e.g., a boson, a fermion, a boson-fermion-spin combination, a molecular system comprising correlated fermions, a lattice system comprising correlated bosons and fermions, and/or another general multi-body quantum system).

QITE ansatz system 102 can be associated with various technologies. For example, QITE ansatz system 102 can be associated with quantum computing technologies, quantum hardware and/or software technologies, quantum algorithm technologies, machine learning technologies, artificial intelligence technologies, cloud computing technologies, and/or other technologies.

QITE ansatz system 102 can provide technical improvements to systems, devices, components, operational steps, and/or processing steps associated with the various technologies identified above. For example, QITE ansatz system 102 can generalize the existing QITE process to provide a universal QITE scheme, referred to herein as the QITE ansatz process, that can be applied to one or more general (e.g., generic) multi-body quantum systems (e.g., a boson, a fermion, a boson-fermion-spin combination, a molecular system comprising correlated fermions, a lattice system comprising correlated bosons and fermions, and/or another general multi-body quantum system). In this example, QITE ansatz system 102 can further apply the QITE ansatz process to a general (e.g., generic) multi-body quantum system (e.g., system 602) by simulating such application as demonstrated by the example numerical experiments described above with reference to FIGS. 6A-6G. In this example, QITE ansatz system 102 can perform such simulation by employing one or more tensor networks to reduce computational costs of a computing device (e.g., a classical computer, a laptop, and/or another computing device) employed by QITE ansatz system 102 to execute such simulation. It should be appreciated, therefore, that QITE ansatz system 102 can thereby facilitate improved (e.g., expanded) application of the existing QITE process and reduced workload of a processor (e.g., processor 106, a quantum processor, and/or another processor) used to simulate the QITE ansatz process of the subject disclosure.

QITE ansatz system 102 can provide technical improvements to a processing unit (e.g., processor 106, a quantum processor, and/or another processor) associated with QITE ansatz system 102. For example, by employing one or more tensor networks to simulate the QITE ansatz process of the subject disclosure, QITE ansatz system 102 can thereby reduce the workload and/or computational costs of a processing unit (e.g., processor 106) used to execute such simulation. In this example, by reducing the workload and/or computational cots of such a processing unit (e.g., processor 106), QITE ansatz system 102 can further facilitate at least one of improved performance or improved efficiency of such a processing unit.

A practical application of QITE ansatz system 102 is that it can be implemented using a classical computing device (e.g., a laptop) to efficiently simulate the application of the QITE ansatz process to compute one or more solutions (e.g., heuristic(s)) to a variety of problems ranging in complexity (e.g., an estimation problem, an optimization problem, and/or another problem) in a variety of domains (e.g., finance, chemistry, medicine, and/or another domain). For example, a practical application of QITE ansatz system 102 is that it can be implemented using a classical computing device (e.g., a laptop) to efficiently simulate the application of the QITE ansatz process to compute one or more solutions (e.g., heuristic(s)) to an estimation problem and/or an optimization problem in the domain of chemistry, medicine, and/or finance, where such a solution can be used to engineer, for instance, a new chemical compound, a new medication, and/or a new option premium.

It should be appreciated that QITE ansatz system 102 provides a new approach driven by relatively new quantum computing technologies. For example, QITE ansatz system 102 provides a new approach to generalize the existing QITE process such that it can be applied to a general multi-body quantum system using a classical computing device (e.g., a laptop) to simulate such application.

QITE ansatz system 102 can employ hardware or software to solve problems that are highly technical in nature, that are not abstract and that cannot be performed as a set of mental acts by a human In some embodiments, one or more of the processes described herein can be performed by one or more specialized computers (e.g., a specialized processing unit, a specialized classical computer, a specialized quantum computer, and/or another type of specialized computer) to execute defined tasks related to the various technologies identified above. QITE ansatz system 102 and/or components thereof, can be employed to solve new problems that arise through advancements in technologies mentioned above, employment of quantum computing systems, cloud computing systems, computer architecture, and/or another technology.

It is to be appreciated that QITE ansatz system 102 can utilize various combinations of electrical components, mechanical components, and circuitry that cannot be replicated in the mind of a human or performed by a human, as the various operations that can be executed by QITE ansatz system 102 and/or components thereof as described herein are operations that are greater than the capability of a human mind. For instance, the amount of data processed, the speed of processing such data, or the types of data processed by QITE ansatz system 102 over a certain period of time can be greater, faster, or different than the amount, speed, or data type that can be processed by a human mind over the same period of time.

According to several embodiments, QITE ansatz system 102 can also be fully operational towards performing one or more other functions (e.g., fully powered on, fully executed, and/or another function) while also performing the various operations described herein. It should be appreciated that such simultaneous multi-operational execution is beyond the capability of a human mind. It should also be appreciated that QITE ansatz system 102 can include information that is impossible to obtain manually by an entity, such as a human user. For example, the type, amount, and/or variety of information included in QITE ansatz system 102, universal component 108, and/or simulation component 110 can be more complex than information obtained manually by a human user.

For simplicity of explanation, the computer-implemented methodologies are depicted and described as a series of acts. It is to be understood and appreciated that the subject innovation is not limited by the acts illustrated and/or by the order of acts, for example acts can occur in various orders and/or concurrently, and with other acts not presented and described herein. Furthermore, not all illustrated acts can be required to implement the computer-implemented methodologies in accordance with the disclosed subject matter. In addition, those skilled in the art will understand and appreciate that the computer-implemented methodologies could alternatively be represented as a series of interrelated states via a state diagram or events. Additionally, it should be further appreciated that the computer-implemented methodologies disclosed hereinafter and throughout this specification are capable of being stored on an article of manufacture to facilitate transporting and transferring such computer-implemented methodologies to computers. The term article of manufacture, as used herein, is intended to encompass a computer program accessible from any computer-readable device or storage media.

Figure 8:
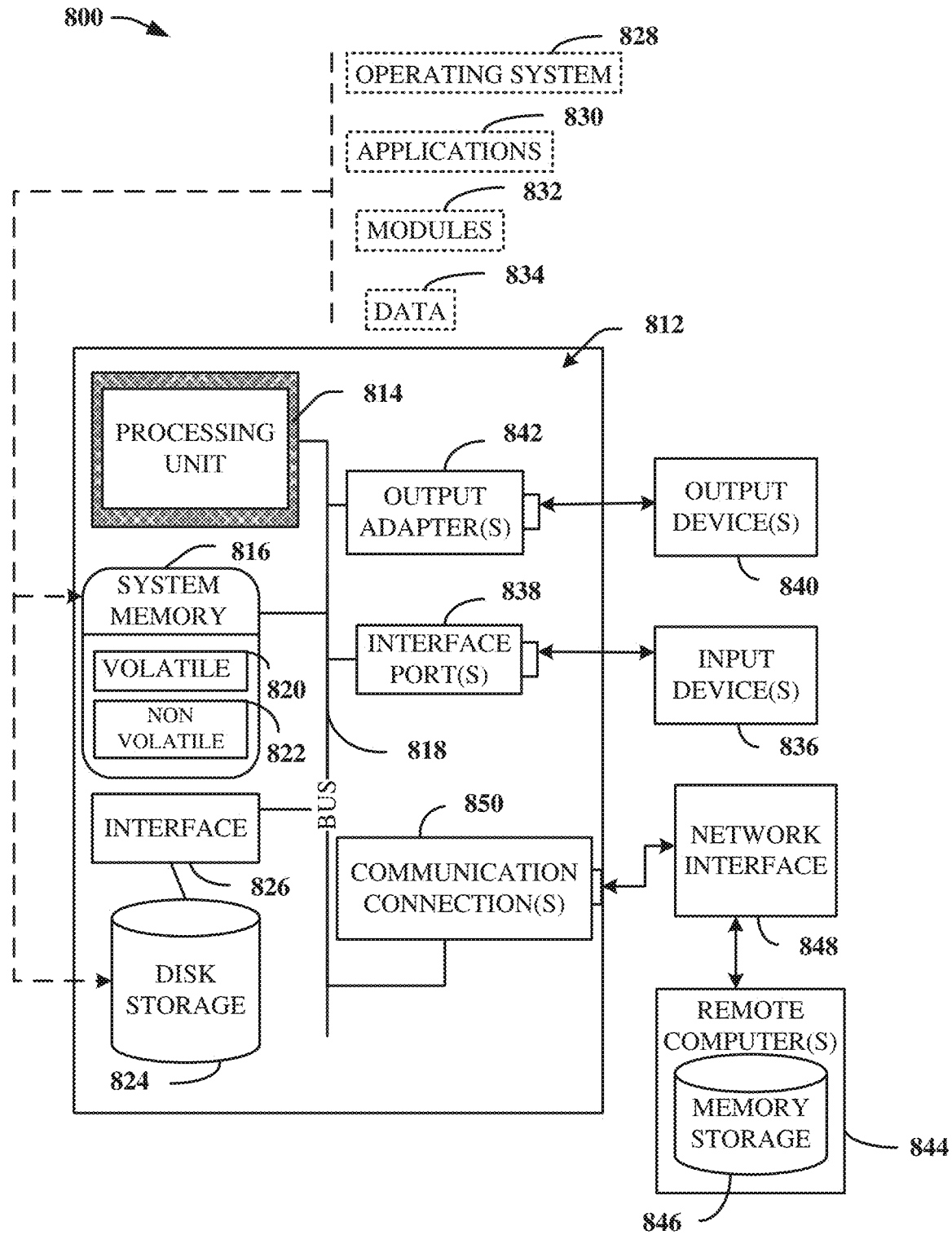
FIG. 8 illustrates a block diagram of an example, non-limiting operating environment in which one or more embodiments described herein can be facilitated.

In order to provide a context for the various aspects of the disclosed subject matter, FIG. 8 as well as the following discussion are intended to provide a general description of a suitable environment in which the various aspects of the disclosed subject matter can be implemented. FIG. 8 illustrates a block diagram of an example, non-limiting operating environment in which one or more embodiments described herein can be facilitated. Repetitive description of like elements employed in other embodiments described herein is omitted for sake of brevity.

With reference to FIG. 8, a suitable operating environment 800 for implementing various aspects of this disclosure can also include a computer 812. The computer 812 can also include a processing unit 814, a system memory 816, and a system bus 818. The system bus 818 couples system components including, but not limited to, the system memory 816 to the processing unit 814. The processing unit 814 can be any of various available processors. Dual microprocessors and other multiprocessor architectures also can be employed as the processing unit 814. The system bus 818 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Firewire (IEEE 1394), and Small Computer Systems Interface (SCSI).

The system memory 816 can also include volatile memory 820 and nonvolatile memory 822. The basic input/output system (BIOS), containing the basic routines to transfer information between elements within the computer 812, such as during start-up, is stored in nonvolatile memory 822. Computer 812 can also include removable/non-removable, volatile/non-volatile computer storage media. FIG. 8 illustrates, for example, a disk storage 824. Disk storage 824 can also include, but is not limited to, devices like a magnetic disk drive, floppy disk drive, tape drive, Jaz drive, Zip drive, LS-100 drive, flash memory card, or memory stick. The disk storage 824 also can include storage media separately or in combination with other storage media. To facilitate connection of the disk storage 824 to the system bus 818, a removable or non-removable interface is typically used, such as interface 826. FIG. 8 also depicts software that acts as an intermediary between users and the basic computer resources described in the suitable operating environment 800. Such software can also include, for example, an operating system 828. Operating system 828, which can be stored on disk storage 824, acts to control and allocate resources of the computer 812.

System applications 830 take advantage of the management of resources by operating system 828 through program modules 832 and program data 834, e.g., stored either in system memory 816 or on disk storage 824. It is to be appreciated that this disclosure can be implemented with various operating systems or combinations of operating systems. A user enters commands or information into the computer 812 through input device(s) 836. Input devices 836 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 814 through the system bus 818 via interface port(s) 838. Interface port(s) 838 include, for example, a serial port, a parallel port, a game port, and a universal serial bus (USB). Output device(s) 840 use some of the same type of ports as input device(s) 836. Thus, for example, a USB port can be used to provide input to computer 812, and to output information from computer 812 to an output device 840. Output adapter 842 is provided to illustrate that there are some output devices 840 like monitors, speakers, and printers, among other output devices 840, which require special adapters. The output adapters 842 include, by way of illustration and not limitation, video and sound cards that provide a means of connection between the output device 840 and the system bus 818. It should be noted that other devices and/or systems of devices provide both input and output capabilities such as remote computer(s) 844.

Computer 812 can operate in a networked environment using logical connections to one or more remote computers, such as remote computer(s) 844. The remote computer(s) 844 can be a computer, a server, a router, a network PC, a workstation, a microprocessor based appliance, a peer device or other common network node and the like, and typically can also include many or all of the elements described relative to computer 812. For purposes of brevity, only a memory storage device 846 is illustrated with remote computer(s) 844. Remote computer(s) 844 is logically connected to computer 812 through a network interface 848 and then physically connected via communication connection 850. Network interface 848 encompasses wire and/or wireless communication networks such as local-area networks (LAN), wide-area networks (WAN), cellular networks, and/or another wire and/or wireless communication network. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL). Communication connection(s) 850 refers to the hardware/software employed to connect the network interface 848 to the system bus 818. While communication connection 850 is shown for illustrative clarity inside computer 812, it can also be external to computer 812. The hardware/software for connection to the network interface 848 can also include, for exemplary purposes only, internal and external technologies such as, modems including regular telephone grade modems, cable modems and DSL modems, ISDN adapters, and Ethernet cards.

Figure 9:
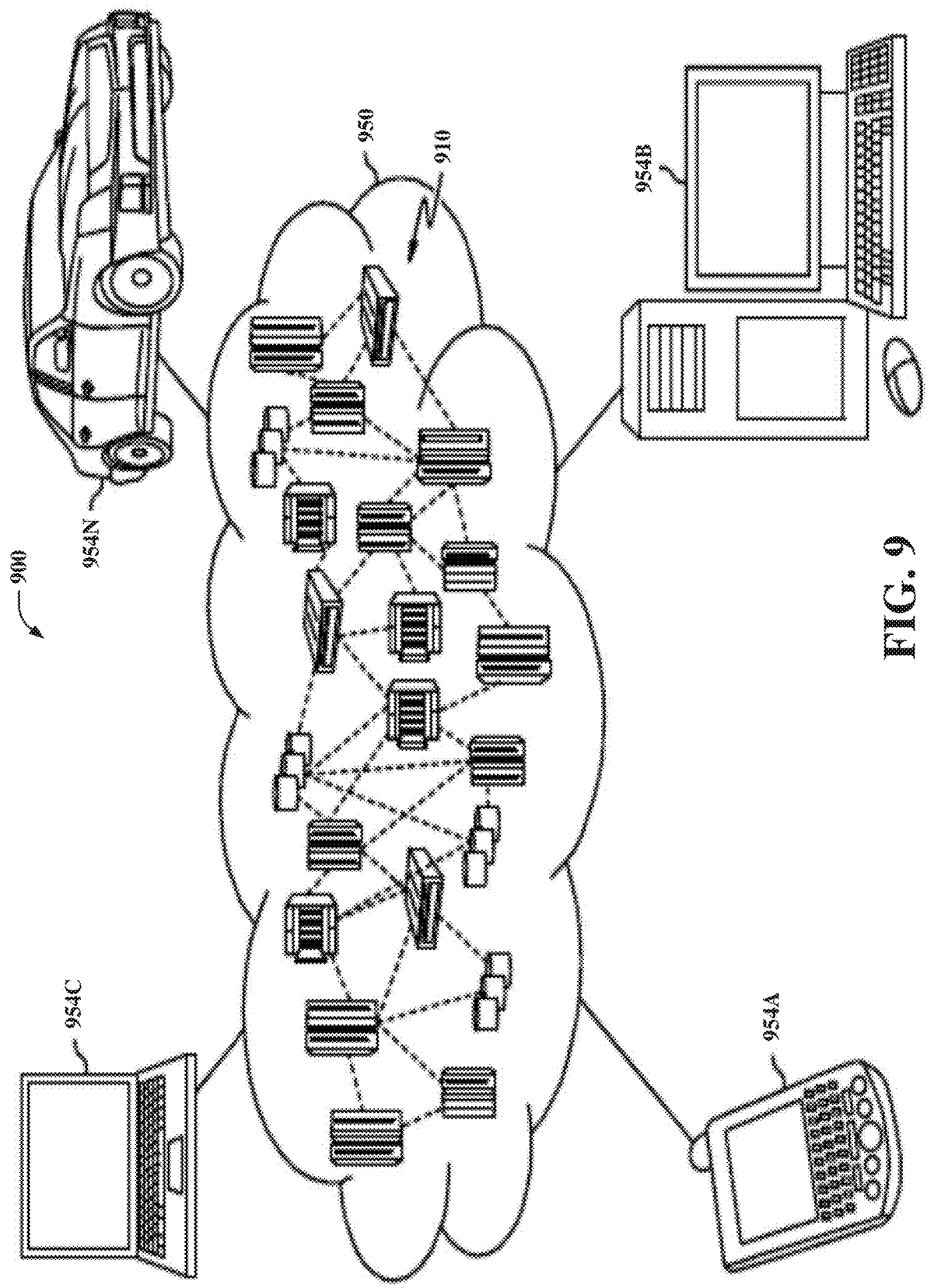
FIG. 9 illustrates a block diagram of an example, non-limiting cloud computing environment in accordance with one or more embodiments of the subject disclosure.

Referring now to FIG. 9, an illustrative cloud computing environment 950 is depicted. As shown, cloud computing environment 950 includes one or more cloud computing nodes 910 with which local computing devices used by cloud consumers, such as, for example, personal digital assistant (PDA) or cellular telephone 954A, desktop computer 954B, laptop computer 954C, and/or automobile computer system 954N may communicate. Although not illustrated in FIG. 9, cloud computing nodes 910 can further comprise a quantum platform (e.g., quantum computer, quantum hardware, quantum software, and/or another quantum platform) with which local computing devices used by cloud consumers can communicate. Nodes 910 may communicate with one another. They may be grouped (not shown) physically or virtually, in one or more networks, such as Private, Community, Public, or Hybrid clouds as described hereinabove, or a combination thereof. This allows cloud computing environment 950 to offer infrastructure, platforms and/or software as services for which a cloud consumer does not need to maintain resources on a local computing device. It is understood that the types of computing devices 954A-N shown in FIG. 9 are intended to be illustrative only and that computing nodes 910 and cloud computing environment 950 can communicate with any type of computerized device over any type of network and/or network addressable connection (e.g., using a web browser).

Figure 10:
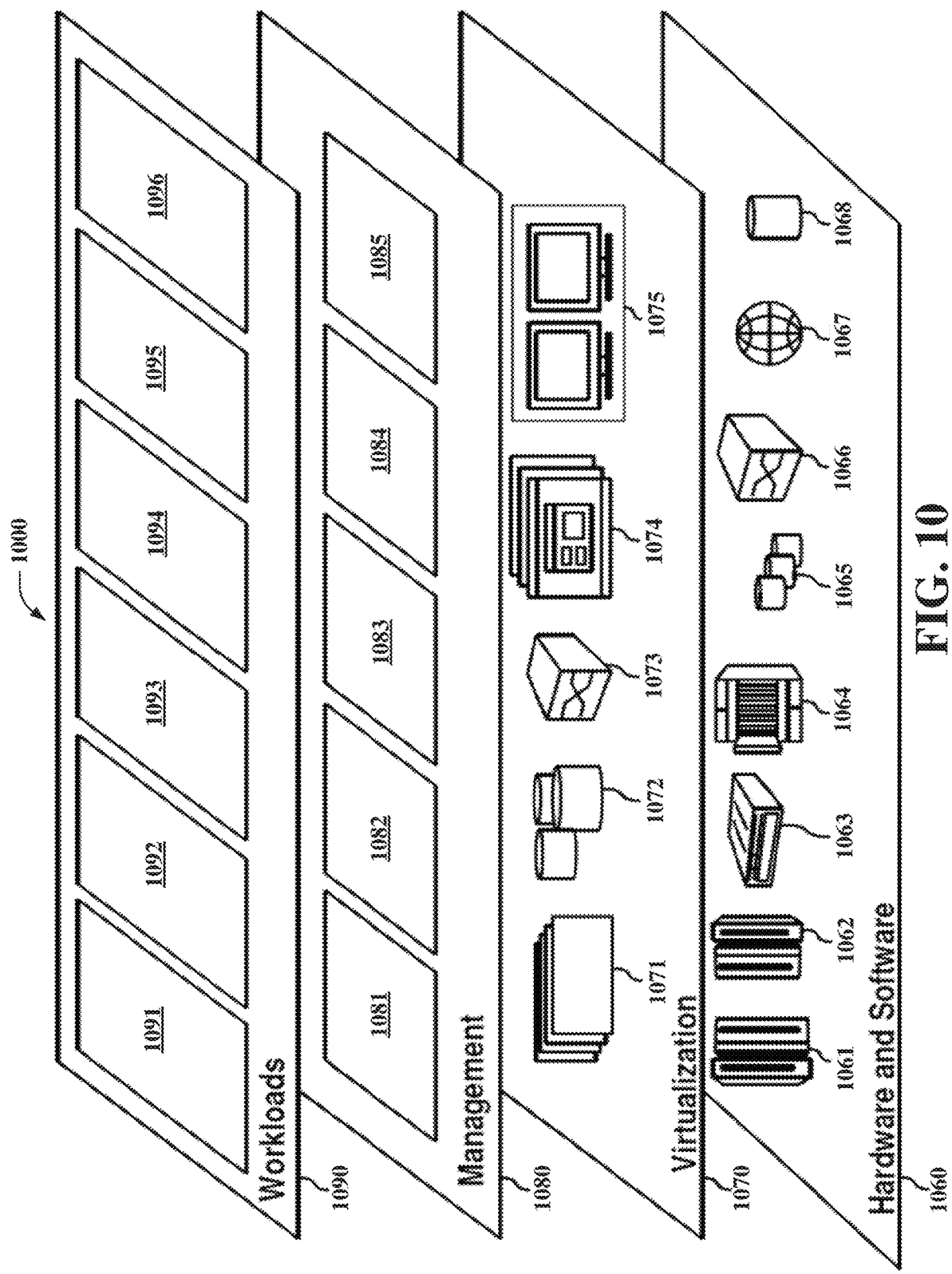
FIG. 10 illustrates a block diagram of example, non-limiting abstraction model layers in accordance with one or more embodiments of the subject disclosure.

Referring now to FIG. 10, a set of functional abstraction layers provided by cloud computing environment 950 (FIG. 9) is shown. It should be understood in advance that the components, layers, and functions shown in FIG. 10 are intended to be illustrative only and embodiments of the invention are not limited thereto. As depicted, the following layers and corresponding functions are provided:

Hardware and software layer 1060 includes hardware and software components. Examples of hardware components include: mainframes 1061; RISC (Reduced Instruction Set Computer) architecture based servers 1062; servers 1063; blade servers 1064; storage devices 1065; and networks and networking components 1066. In some embodiments, software components include network application server software 1067, database software 1068, quantum platform routing software (not illustrated in FIG. 10), and/or quantum software (not illustrated in FIG. 10).

Virtualization layer 1070 provides an abstraction layer from which the following examples of virtual entities may be provided: virtual servers 1071; virtual storage 1072; virtual networks 1073, including virtual private networks; virtual applications and operating systems 1074; and virtual clients 1075.

In one example, management layer 1080 may provide the functions described below. Resource provisioning 1081 provides dynamic procurement of computing resources and other resources that are utilized to perform tasks within the cloud computing environment. Metering and Pricing 1082 provide cost tracking as resources are utilized within the cloud computing environment, and billing or invoicing for consumption of these resources. In one example, these resources may include application software licenses. Security provides identity verification for cloud consumers and tasks, as well as protection for data and other resources. User portal 1083 provides access to the cloud computing environment for consumers and system administrators. Service level management 1084 provides cloud computing resource allocation and management such that required service levels are met. Service Level Agreement (SLA) planning and fulfillment 1085 provide pre-arrangement for, and procurement of, cloud computing resources for which a future requirement is anticipated in accordance with an SLA.

Workloads layer 1090 provides examples of functionality for which the cloud computing environment may be utilized. Non-limiting examples of workloads and functions which may be provided from this layer include: mapping and navigation 1091; software development and lifecycle management 1092; virtual classroom education delivery 1093; data analytics processing 1094; transaction processing 1095; and quantum imaginary time evolution (QITE) ansatz software 1096.

The present invention may be a system, a method, an apparatus and/or a computer program product at any possible technical detail level of integration. The computer program product can include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer and/or computers, those skilled in the art will recognize that this disclosure also can or can be implemented in combination with other program modules. Generally, program modules include routines, programs, components, data structures, and/or other program modules that perform particular tasks and/or implement particular abstract data types. Moreover, those skilled in the art will appreciate that the inventive computer-implemented methods can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments in which tasks are performed by remote processing devices that are linked through a communications network. However, some, if not all aspects of this disclosure can be practiced on stand-alone computers. In a distributed computing environment, program modules can be located in both local and remote memory storage devices. For example, in one or more embodiments, computer executable components can be executed from memory that can include or be comprised of one or more distributed memory units. As used herein, the term "memory" and "memory unit" are interchangeable. Further, one or more embodiments described herein can execute code of the computer executable components in a distributed manner, e.g., multiple processors combining or working cooperatively to execute code from one or more distributed memory units. As used herein, the term "memory" can encompass a single memory or memory unit at one location or multiple memories or memory units at one or more locations.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other means to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store," "storage," "data store," "data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or nonvolatile random access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems and computer-implemented methods. It is, of course, not possible to describe every conceivable combination of components or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A system, comprising:
   a memory that stores computer executable components; and
   a processor that executes at least one of the computer executable components that:
      generalizes, with respect to a multi-body quantum system comprising at least one of a boson or a fermion, a quantum imaginary time evolution process to provide a quantum imaginary time evolution ansatz process, wherein the generalizing comprises:
         associating a metric space of vertices to the multi-body quantum system,
         for each vertex of the vertices, associate a respective set of orbitals,
         for each orbital of the respective set of orbitals, associate a local Hilbert space with a respective defined number of dimensions and spin, Bose, Fermi type with a local basis comprised of a quantity of real-valued operators that is the respective defined number squared, and generating a real-valued wavefunction that is based on an imaginary time evolution under a Hamiltonian that is a linear combination of a subset of the real-valued operators mapped onto a product of unitary operators; and simulates, using at least one tensor network, the real-valued wavefunction of the multi-body quantum system, wherein the at least one tensor network represents the real-valued wavefunction and operator expansion coefficients of the linear combination of the subset of the real-valued operators with a predefined maximum bond to reduce memory employed by the system to store the real-valued wavefunction of the multi-body quantum system.

2. The system of claim 1, wherein the at least one of the computer executable components performs the generalization so that the quantum imaginary time evolution ansatz process preserves the real-valued wavefunction to enforce a defined property of the imaginary time evolution in presence of time reversal symmetry.

3. The system of claim 1, wherein the at least one of the computer executable components performs the generalization so that the quantum imaginary time evolution ansatz process integrates a variational optimization of a step length with the quantum imaginary time evolution process.

4. The system of claim 1, wherein the generalizing further comprises finding, via a Davidson diagonalization process, the operator expansion coefficients of the linear combination of the subset of the real-valued operators.

5. The system of claim 4, wherein the Davidson diagonalization process reduces scaling from a third power to a second power in a domain of the linear combination of the subset of the real-valued operators.

6. A computer-implemented method, comprising:
generalizing, by a system operatively coupled to a processor, with respect to a multi-body quantum system comprising at least one of a boson or a fermion, a quantum imaginary time evolution process to provide a quantum imaginary time evolution ansatz process, wherein the generalizing comprises:
associating a metric space of vertices to the multi-body quantum system,
for each vertex of the vertices, associate a respective set of orbitals,
for each orbital of the respective set of orbitals, associate a local Hilbert space with a respective defined number of dimensions and spin, Bose, Fermi type with a local basis comprised of a quantity of real-valued operators that is the respective defined number squared, and
generating a real-valued wavefunction that is based on an imaginary time evolution under a Hamiltonian that is a linear combination of a subset of the real-valued operators mapped onto a product of unitary operators; and
simulating, by the system using at least one tensor network, the real-valued wavefunction of the multi-body quantum system, wherein the at least one tensor network represents the real-valued wavefunction and operator expansion coefficients of the linear combination of the subset of the real-valued operators with a predefined maximum bond to reduce memory employed by the system to store the real-valued wavefunction of the multi-body quantum system.

7. The computer-implemented method of claim 6, further comprising:
performing, by the system, the generalization so that the quantum imaginary time evolution ansatz process preserves the real-valued wavefunction to enforce a defined property of the imaginary time evolution in presence of time reversal symmetry.

8. The computer-implemented method of claim 6, further comprising:
performing, by the system, the generalization so that the quantum imaginary time evolution ansatz process integrates a variational optimization of a step length with the quantum imaginary time evolution process.

9. The computer-implemented method of claim 6, wherein the generalizing further comprises finding, via a Davidson diagonalization process, the operator expansion coefficients of the linear combination of the subset of the real-valued operators.

10. The computer-implemented method of claim 9, wherein the Davidson diagonalization process reduces scaling from a third power to a second power in a domain of the linear combination of the subset of the real-valued operators.

11. A computer program product comprising a computer readable storage medium having program instructions embodied therewith, the program instructions executable by a processor to cause the processor to:
generalize, with respect to a multi-body quantum system comprising at least one of a boson or a fermion, a quantum imaginary time evolution process to provide a quantum imaginary time evolution ansatz process, wherein the generalizing comprises:
associating a metric space of vertices to the multi-body quantum system,
for each vertex of the vertices, associate a respective set of orbitals,
for each orbital of the respective set of orbitals, associate a local Hilbert space with a respective defined number of dimensions and spin, Bose, Fermi type with a local basis comprised of a quantity of real-valued operators that is the respective defined number squared, and
generating a real-valued wavefunction that is based on an imaginary time evolution under a Hamiltonian that is a linear combination of a subset of the real-valued operators mapped onto a product of unitary operators; and
simulate, using at least one tensor network, the real-valued wavefunction of the multi-body quantum system, wherein the at least one tensor network represents the real-valued wavefunction and operator expansion coefficients of the linear combination of the subset of the real-valued operators with a predefined maximum bond to reduce memory employed to store the real-valued wavefunction of the multi-body quantum system.

12. The computer program product of claim 11, wherein the program instructions are further executable by the processor to cause the processor to:
perform the generalization so that the quantum imaginary time evolution ansatz process preserves the real-valued wavefunction to enforce a defined property of the imaginary time evolution in presence of time reversal symmetry.

13. The computer program product of claim 11, wherein the program instructions are further executable by the processor to cause the processor to:

perform the generalization so that the quantum imaginary time evolution ansatz process integrates a variational optimization of a step length with the quantum imaginary time evolution process.

14. The computer program product of claim 11, wherein the generalizing further comprises finding, via a Davidson diagonalization process, the operator expansion coefficients of the linear combination of the subset of the real-valued operators.

15. The computer program product of claim 14, wherein the Davidson diagonalization process reduces scaling from a third power to a second power in a domain of the linear combination of the subset of the real-valued operators.

\* \* \* \* \*